(12) United States Patent
Sato et al.

(10) Patent No.: US 9,960,278 B2
(45) Date of Patent: May 1, 2018

(54) MANUFACTURING METHOD OF SEMICONDUCTOR DEVICE

(76) Inventors: Yuhei Sato, Atsugi (JP); Keiji Sato, Isehara (JP); Toshinari Sasaki, Tochigi (JP); Tetsunori Maruyama, Atsugi (JP); Atsuo Isobe, Isehara (JP); Tsutomu Murakawa, Isehara (JP); Sachiaki Tezuka, Atsugi (JP)

( * ) Notice: Subject to any disclaimer, the term of this patent is extended or adjusted under 35 U.S.C. 154(b) by 250 days.

(21) Appl. No.: 13/437,271

(22) Filed: Apr. 2, 2012

(65) Prior Publication Data

US 2012/0258575 A1 Oct. 11, 2012

(30) Foreign Application Priority Data

Apr. 6, 2011 (JP) .................. 2011-084389

(51) Int. Cl.
*H01L 29/786* (2006.01)
*H01L 29/66* (2006.01)
(Continued)

(52) U.S. Cl.
CPC ........ *H01L 29/7869* (2013.01); *H01L 21/477* (2013.01)

(58) Field of Classification Search
CPC ............... H01L 21/477; H01L 29/7869; H01L 29/78666; H01L 29/66742; H01L 27/3258;
(Continued)

(56) References Cited

U.S. PATENT DOCUMENTS 5,198,379 A * 3/1993 Adan ................ H01L 29/66477
257/E21.409
5,362,661 A 11/1994 Kim
(Continued)

FOREIGN PATENT DOCUMENTS

CN 001577771 A 2/2005
CN 101071816 A 11/2007
(Continued)

OTHER PUBLICATIONS

Taiwanese Office Action (Application No. 101112064) dated Jun. 2, 2016.
(Continued)

*Primary Examiner* — Mark Tornow
*Assistant Examiner* — Priya Rampersaud
(74) *Attorney, Agent, or Firm* — Robinson Intellectual Property Law Office; Eric J. Robinson

(57) ABSTRACT

To provide a highly reliable semiconductor device manufactured by giving stable electric characteristics to a semiconductor device including an oxide semiconductor. In a manufacturing process of a transistor, an oxide semiconductor layer, a source electrode layer, a drain electrode layer, a gate insulating film, a gate electrode layer, and an aluminum oxide film are formed in this order, and then heat treatment is performed on the oxide semiconductor layer and the aluminum oxide film, whereby an oxide semiconductor layer from which an impurity containing a hydrogen atom is removed and which includes a region containing oxygen
(Continued)

more than the stoichiometric proportion is formed. In addition, when the aluminum oxide film is formed, entry and diffusion of water or hydrogen into the oxide semiconductor layer from the air due to heat treatment in a manufacturing process of a semiconductor device or an electronic appliance including the transistor can be prevented.

19 Claims, 16 Drawing Sheets

(51) Int. Cl.
  *H01L 27/32* (2006.01)
  *H01L 21/477* (2006.01)
(58) Field of Classification Search
  CPC ............. H01L 29/78618; H01L 29/786; H01L 29/78609; H01L 2924/13069
  See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,476,901 B2 | 1/2009 | Oh | |
| 7,501,293 B2 | 3/2009 | Ito et al. | |
| 7,598,520 B2 | 10/2009 | Hirao et al. | |
| 7,651,896 B2 | 1/2010 | Honda et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,977,168 B2 | 7/2011 | Honda et al. | |
| 7,993,964 B2 | 8/2011 | Hirao et al. | |
| 8,093,589 B2 | 1/2012 | Sugihara et al. | |
| 8,164,090 B2 | 4/2012 | Iwasaki et al. | |
| 8,198,666 B2 | 6/2012 | Asami et al. | |
| 8,441,007 B2 | 5/2013 | Arai | |
| 8,476,625 B2 | 7/2013 | Kimura | |
| 8,502,216 B2 | 8/2013 | Akimoto et al. | |
| 8,629,434 B2 | 1/2014 | Arai | |
| 8,659,014 B2 | 2/2014 | Honda et al. | |
| 8,765,522 B2 | 7/2014 | Yamazaki | |
| 8,993,386 B2 | 3/2015 | Ohara et al. | |
| 8,999,750 B2 | 4/2015 | Kimura | |
| 9,082,857 B2 | 7/2015 | Yamazaki et al. | |
| 9,112,043 B2 | 8/2015 | Arai | |
| 9,201,280 B2 | 12/2015 | Kimura | |
| 9,478,597 B2 | 10/2016 | Yamazaki et al. | |
| 2001/0038127 A1* | 11/2001 | Yamazaki et al. | 257/359 |
| 2001/0046027 A1 | 11/2001 | Tai et al. | |
| 2002/0056338 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1* | 1/2005 | Hoffman | H01L 29/105 257/347 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0057618 A1 | 3/2008 | Honda et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0057674 A1* | 3/2009 | Jeong et al. | 257/59 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0278131 A1* | 11/2009 | Kwon et al. | 257/72 |
| 2009/0280600 A1 | 11/2009 | Hosono et al. | |
| 2009/0283763 A1* | 11/2009 | Park | H01L 29/78621 257/43 |
| 2009/0321731 A1 | 12/2009 | Jeong et al. | |
| 2010/0051949 A1* | 3/2010 | Yamazaki et al. | 257/57 |
| 2010/0065838 A1* | 3/2010 | Yamazaki et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117071 A1* | 5/2010 | Inoue | H01L 29/7869 257/43 |
| 2010/0117075 A1* | 5/2010 | Akimoto et al. | 257/43 |
| 2010/0140613 A1 | 6/2010 | Kimura | |

(56) References Cited

U.S. PATENT DOCUMENTS

| | | | |
|---|---|---|---|
| 2010/0159639 A1* | 6/2010 | Sakata | 438/104 |
| 2010/0163865 A1 | 7/2010 | Arai | |
| 2010/0213531 A1 | 8/2010 | Asami et al. | |
| 2010/0224878 A1 | 9/2010 | Kimura | |
| 2011/0057187 A1* | 3/2011 | Sakakura | H01L 27/1225 257/43 |
| 2011/0089927 A1* | 4/2011 | Yamazaki | H02M 3/073 323/311 |
| 2011/0089975 A1* | 4/2011 | Yamazaki | H01L 27/1225 326/102 |
| 2011/0090006 A1* | 4/2011 | Yamazaki | H01L 27/1225 327/581 |
| 2011/0147738 A1* | 6/2011 | Yamazaki | H01L 21/02554 257/43 |
| 2011/0175090 A1 | 7/2011 | Sugihara et al. | |
| 2011/0187410 A1* | 8/2011 | Kato et al. | 326/46 |
| 2011/0204362 A1* | 8/2011 | Akimoto | H01L 29/41733 257/52 |
| 2012/0132908 A1 | 5/2012 | Sugihara et al. | |
| 2012/0175609 A1* | 7/2012 | Yamazaki | H01L 29/7869 257/43 |
| 2013/0299824 A1 | 11/2013 | Akimoto et al. | |
| 2014/0087517 A1 | 3/2014 | Akimoto et al. | |
| 2015/0194509 A1 | 7/2015 | Ohara et al. | |
| 2015/0303280 A1 | 10/2015 | Yamazaki et al. | |

FOREIGN PATENT DOCUMENTS

| | | |
|---|---|---|
| EP | 0457434 A | 11/1991 |
| EP | 1737044 A | 12/2006 |
| EP | 2159845 A | 3/2010 |
| EP | 2175493 A | 4/2010 |
| EP | 2226847 A | 9/2010 |
| JP | 60-198861 A | 10/1985 |
| JP | 61-116874 A | 6/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-010660 A | 1/1992 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006-165528 A | 6/2006 |
| JP | 2008-085312 A | 4/2008 |
| JP | 2010-016163 A | 1/2010 |
| JP | 2010-080952 A | 4/2010 |
| JP | 2010-093070 A | 4/2010 |
| JP | 2010-156963 A | 7/2010 |
| JP | 2010-170110 A | 8/2010 |
| JP | 2010-219511 A | 9/2010 |
| JP | 2011-003775 A | 1/2011 |
| JP | 2011-009415 A | 1/2011 |
| JP | 2011-135064 A | 7/2011 |
| TW | 200802736 | 1/2008 |
| TW | 201021211 | 6/2010 |
| TW | 201029184 | 8/2010 |
| TW | 201034201 | 9/2010 |
| TW | 201044595 | 12/2010 |
| TW | 201104759 | 2/2011 |
| WO | WO-2004/114391 | 12/2004 |
| WO | WO-2007/142167 | 12/2007 |
| WO | WO-2010/032629 | 3/2010 |
| WO | WO-2010/053060 | 5/2010 |
| WO | WO-2010/103935 | 9/2010 |
| WO | WO-2011/065210 | 6/2011 |

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

(56) References Cited

OTHER PUBLICATIONS

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122101-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Chinese Office Action (Application No. 201210098750.8) dated Apr. 12, 2016.

Taiwanese Office Action (Application No. 105130628) dated Feb. 9, 2017.

* cited by examiner

FIG. 11A1
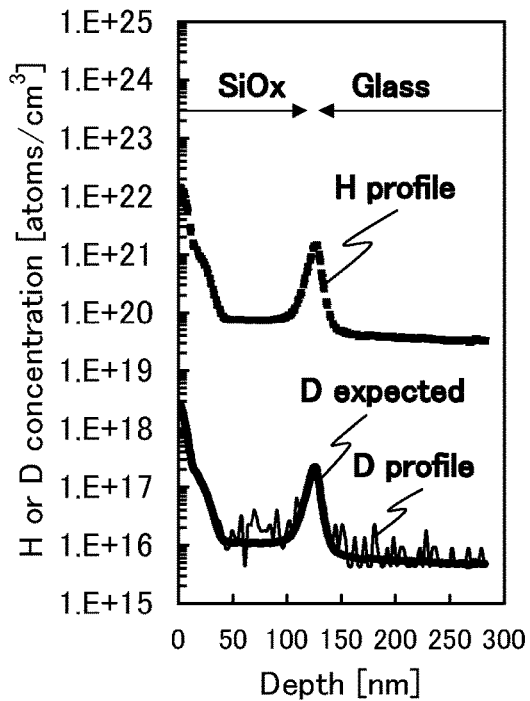
FIG. 11A2
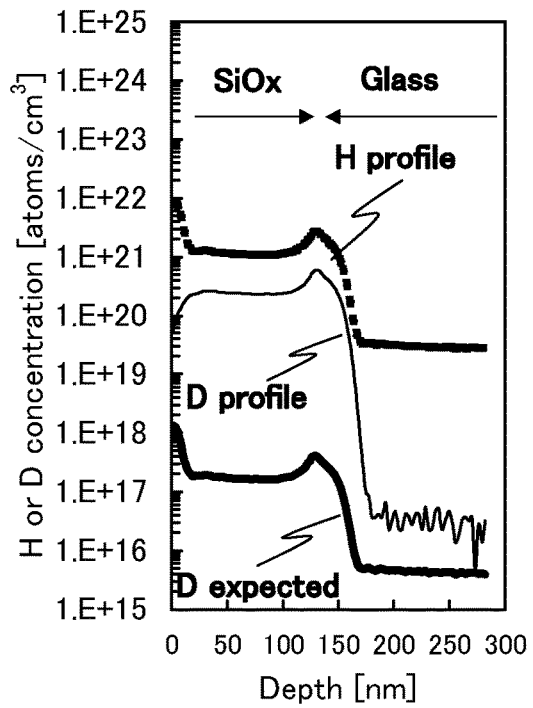
FIG. 11B1
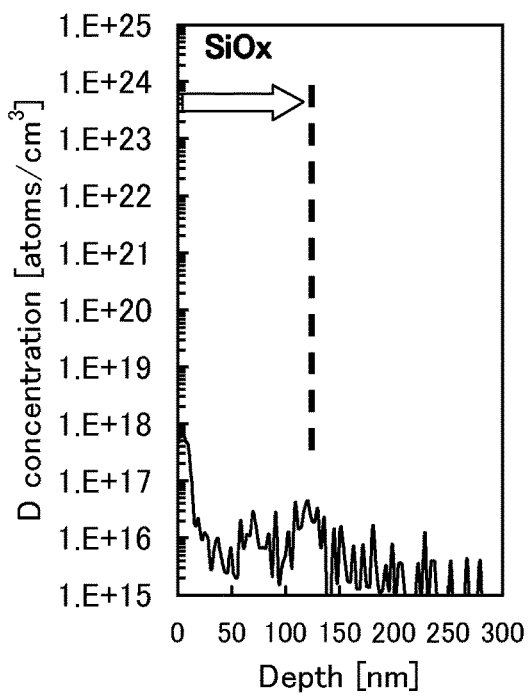
FIG. 11B2
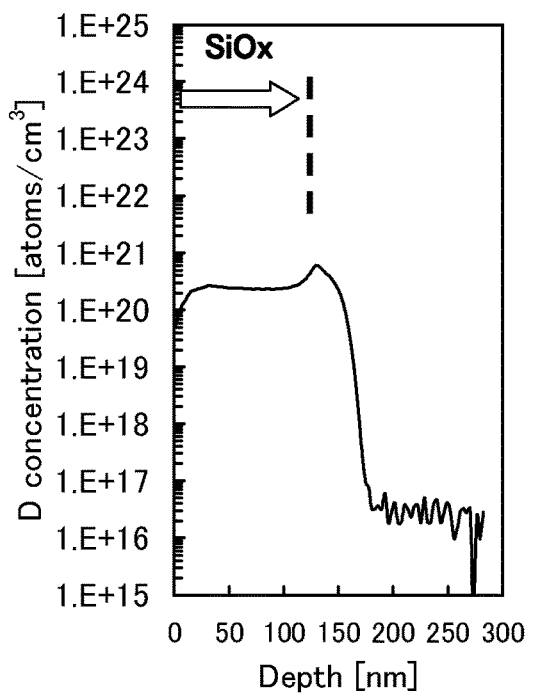

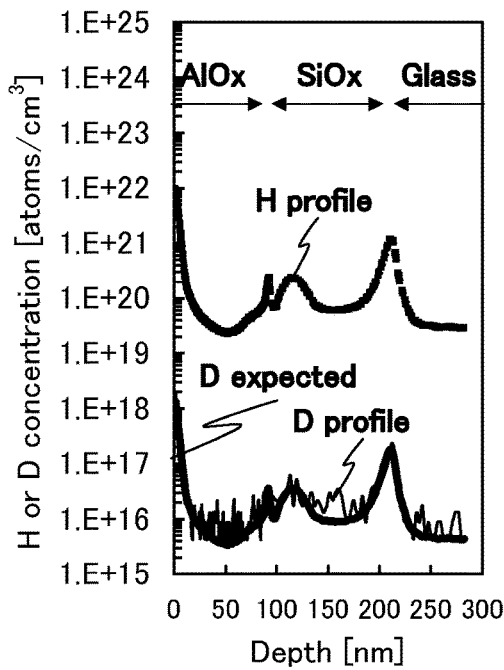
FIG. 12A1
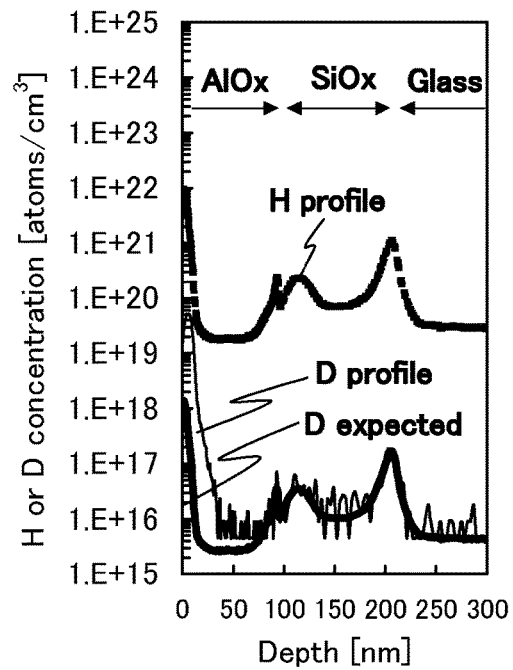
FIG. 12A2
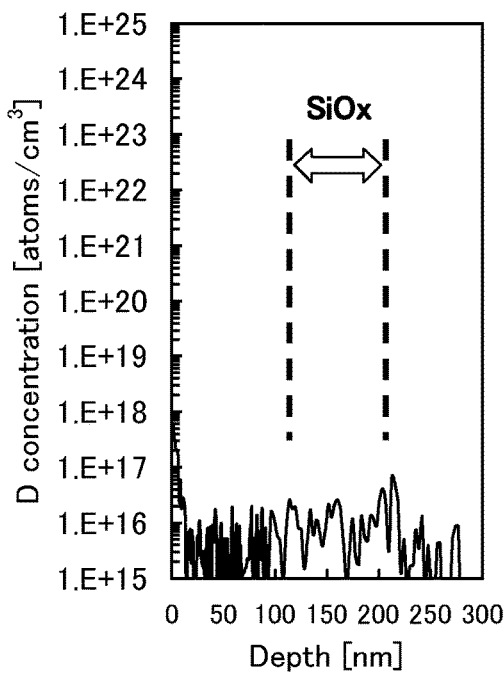
FIG. 12B1
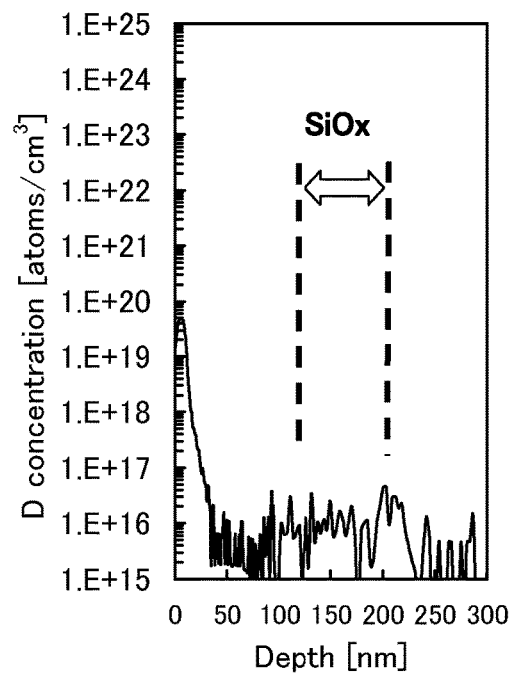
FIG. 12B2

MANUFACTURING METHOD OF SEMICONDUCTOR DEVICE

BACKGROUND OF THE INVENTION

1. Field of the Invention

The present invention relates to a semiconductor device and a manufacturing method thereof.

In this specification, a semiconductor device generally means any device which can function by utilizing semiconductor characteristics, and an electrooptic device, a semiconductor circuit, and an electronic appliance are all semiconductor devices.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to the transistor; in addition, an oxide semiconductor has been attracting attention as another material.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

SUMMARY OF THE INVENTION

However, when hydrogen or water, which forms an electron donor, enters an oxide semiconductor or oxygen is released from an oxide semiconductor in a manufacturing process of a device, the electrical conductivity of the oxide semiconductor may change. Such a phenomenon causes variation in the electric characteristics of a transistor using the oxide semiconductor.

In particular, there is a problem in that by heat treatment in a manufacturing process of a semiconductor device or an electronic appliance including the transistor, water or hydrogen enters and diffuses into an oxide semiconductor layer from the air, so that the electric characteristics of the completed transistor vary.

In view of the above problem, an object of one embodiment of the present invention is to provide a highly reliable semiconductor device including an oxide semiconductor, which has stable electric characteristics.

In a manufacturing process of a transistor including an oxide semiconductor layer, a gate insulating film is formed over and in contact with the oxide semiconductor layer, a gate electrode layer is formed over the gate insulating film, and an aluminum oxide film is formed over and in contact with the gate insulating film and the gate electrode layer; thus, entry and diffusion of water or hydrogen into the oxide semiconductor layer from the air due to heat treatment in a manufacturing process of a semiconductor device or an electronic appliance including the transistor can be prevented.

One embodiment of the disclosed invention is a method for manufacturing a semiconductor device including the steps of: manufacturing a transistor; and performing heat treatment on the transistor. The transistor is manufactured in the following manner: a base insulating film is formed; an oxide semiconductor layer is formed over and in contact with the base insulating film; a source electrode layer and a drain electrode layer are formed over the oxide semiconductor layer; a gate insulating film is formed over and in contact with the oxide semiconductor layer, the source electrode layer, and the drain electrode layer; a gate electrode layer is formed over the gate insulating film in a region overlapping with the oxide semiconductor layer; and an aluminum oxide film is formed over and in contact with the gate insulating film and the gate electrode layer. The thickness of the aluminum oxide film is greater than 50 nm and less than or equal to 500 nm.

Another embodiment of the disclosed invention is a method for manufacturing a semiconductor device including the steps of: forming a base insulating film; forming an oxide semiconductor layer over and in contact with the base insulating film; forming a source electrode layer and a drain electrode layer over the oxide semiconductor layer; forming a gate insulating film over and in contact with the oxide semiconductor layer, the source electrode layer, and the drain electrode layer; forming a gate electrode layer over the gate insulating film in a region overlapping with the oxide semiconductor layer; forming an aluminum oxide film over and in contact with the gate insulating film and the gate electrode layer; and performing heat treatment on the oxide semiconductor layer. The thickness of the aluminum oxide film is greater than 50 nm and less than or equal to 500 nm.

In the above methods for manufacturing a semiconductor device, it is preferable that heat treatment be further performed on the oxide semiconductor layer just after the oxide semiconductor layer is formed.

In the above methods for manufacturing a semiconductor device, an interlayer insulating film may be formed over the aluminum oxide film.

In the above methods for manufacturing a semiconductor device, the interlayer insulating film is preferably formed using silicon oxynitride.

In the above methods for manufacturing a semiconductor device, an impurity element may be added to the oxide semiconductor layer by an ion doping method or an ion implantation method after the gate electrode layer is formed.

In the above methods for manufacturing a semiconductor device, the oxide semiconductor layer is preferably formed while being heated.

In the above methods for manufacturing a semiconductor device, at least one of the base insulating film and the gate insulating film includes a region in which the oxygen content is preferably higher than the stoichiometric proportion.

In the above methods for manufacturing a semiconductor device, a channel length determined by a distance between the source electrode layer and the drain electrode layer which are adjacent to each other over the oxide semiconductor layer is preferably less than or equal to 2 µm.

In a manufacturing process of a transistor, after an oxide semiconductor layer, a source electrode layer, a drain electrode layer, a gate insulating film, and a gate electrode layer are formed in this order, an aluminum oxide film is formed to a thickness of greater than 50 nm and less than or equal to 500 nm over and in contact with the gate insulating film and the gate electrode layer; thus, entry and diffusion of water or hydrogen into the oxide semiconductor layer from the air due to heat treatment in a manufacturing process of a semiconductor device or an electronic appliance including

BRIEF DESCRIPTION OF THE DRAWINGS

FIGS. 11A1, 11A2, 11B1, and 11B2 show SIMS data of a comparative sample A.

FIGS. 12A1, 12A2, 12B1, and 12B2 show SIMS data of an example sample A.

DETAILED DESCRIPTION OF THE INVENTION

Figure 1A:
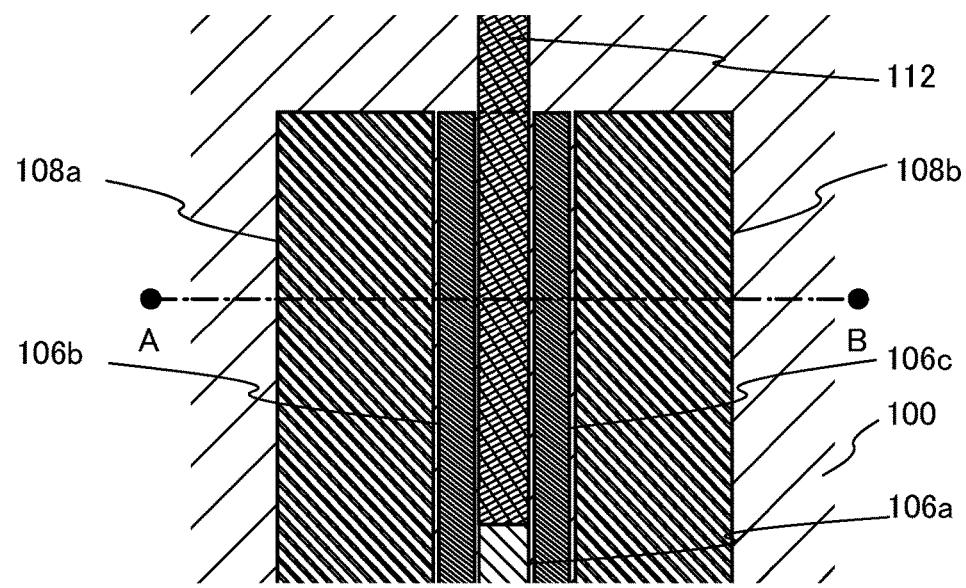
FIGS. 1A and 1B are a plan view and a cross-sectional view illustrating one embodiment of a semiconductor device.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below. In describing structures of the present invention with reference to the drawings, the same reference numerals are used in common for the same portions in different drawings. The same hatching pattern may be applied to similar parts, and the similar parts may not be especially denoted by reference numerals in some cases. In addition, for convenience, an insulating film is not illustrated in a top view in some cases.

Furthermore, hereinafter, ordinal numbers, such as "first" and "second," are used merely for convenience, and the present invention is not limited to the numbers.

Embodiment 1

In this embodiment, a method for manufacturing a semiconductor device including a transistor according to one embodiment of the present invention will be described with reference to FIGS. 1A and 1B, FIGS. 2A to 2C, and FIGS. 3A to 3C.

Figure 1B:
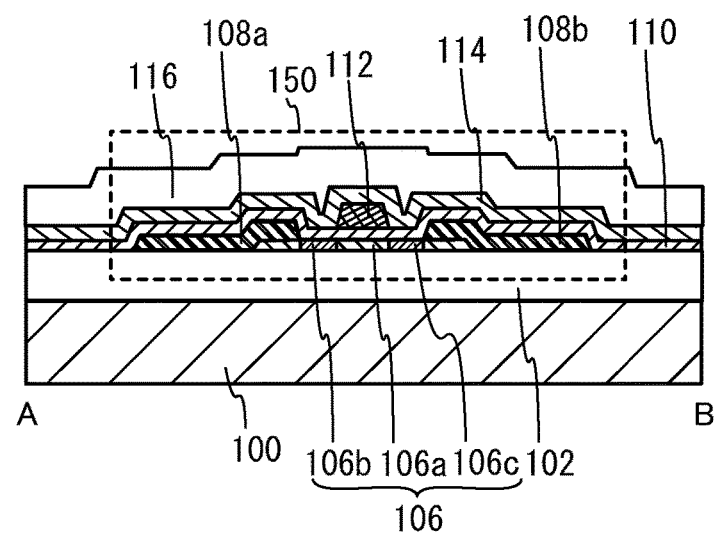

FIGS. 1A and 1B are a plane view and a cross-sectional view of a transistor 150 which is a top-gate top-contact transistor. FIG. 1A is a plan view and FIG. 1B is a cross-sectional view taken along line A-B in FIG. 1A. Note that in FIG. 1A, some of the components of the transistor 150 (e.g., an insulating film 114) are omitted for simplicity.

<Structure of Semiconductor Device According to this Embodiment>

FIGS. 1A and 1B are an example of a structure of a semiconductor device manufactured according to a method of this embodiment. The transistor 150 in FIGS. 1A and 1B includes a substrate 100, a base insulating film 102 formed over the substrate 100, an oxide semiconductor layer 106 formed over and in contact with the base insulating film 102, a source electrode layer 108a and a drain electrode layer 108b formed over the oxide semiconductor layer 106, a gate insulating film 110 formed over and in contact with the oxide semiconductor layer 106, the source electrode layer 108a, and the drain electrode layer 108b, a gate electrode layer 112 formed over the gate insulating film 110 in a region overlapping with the oxide semiconductor layer 106, the insulating film 114 formed over and in contact with the gate insulating film 110 and the gate electrode layer 112, and an interlayer insulating film 116 formed over the insulating film 114. After the formation of the gate electrode layer 112, an impurity element is added to the oxide semiconductor layer 106, whereby first regions 106a are formed in a region of the oxide semiconductor layer 106, which is overlapping with the source electrode layer 108a, the drain electrode layer 108b, or the gate electrode layer 112, and a second region 106b and a second region 106c are formed in regions of the oxide semiconductor layer 106, which are not overlapping with the source electrode layer 108a, the drain electrode layer 108b, or the gate electrode layer 112.

<Manufacturing Method of Semiconductor Device According to this Embodiment>

A method for manufacturing the transistor 150 will be described with reference to FIGS. 2A to 2C and FIGS. 3A to 3C.

Figure 2A:
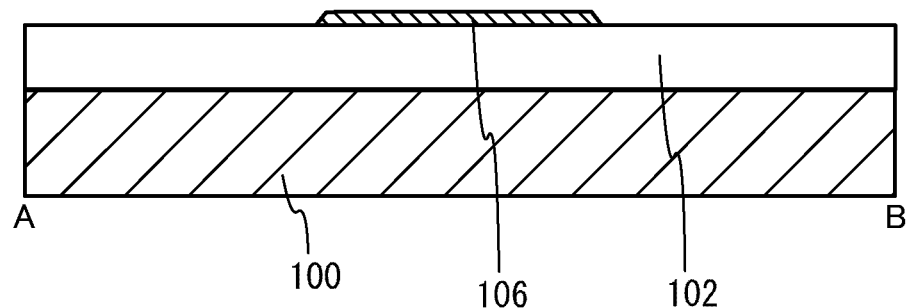
FIGS. 2A to 2C are cross-sectional views illustrating one embodiment of a method for manufacturing a semiconductor device.

First, the base insulating film 102 is formed over the substrate 100, and the oxide semiconductor layer 106 is selectively formed over and in contact with the base insulating film 102 (see FIG. 2A).

A substrate having an insulating surface may be used as the substrate 100. For example, a glass substrate, a quartz substrate, a semiconductor substrate having an insulating film formed on its surface, or a stainless steel substrate having an insulating film formed on its surface may be used as the substrate 100.

The base insulating film 102 can be formed using silicon oxide, silicon nitride, silicon oxynitride, or silicon nitride oxide by a sputtering method. Further, the base insulating film 102 can be formed so as to include aluminum oxide, tantalum oxide, hafnium oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, or the like. Water and hydrogen are preferably removed as much as possible from the base insulating film 102 in contact with the oxide semiconductor layer 106. The base insulating film 102 may be a single layer or a stack of a plurality of layers.

Note that in this specification, "oxynitride" such as silicon oxynitride contains more oxygen than nitrogen.

In this specification, "nitride oxide" such as silicon nitride oxide contains more nitrogen than oxygen.

In the transistor 150 in FIGS. 1A and 1B, at least one of the base insulating film 102 and the gate insulating film 110 preferably includes a region in which the oxygen content is higher than the stoichiometric proportion. In that case, the oxygen content is higher than the stoichiometric proportion of the base insulating film or the gate insulating film. For example, in the case of using a silicon oxide film whose composition is expressed by $SiO_x$ (x>0), the stoichiometric proportion of silicon oxide is Si:O=1:2; therefore, a silicon oxide film including an excessive oxygen region, in which x is greater than 2, is preferably used. Such an excessive oxygen region may exist in part of the silicon oxide film (including its interface).

When the insulating film in contact with the oxide semiconductor layer 106 includes a region in which the oxygen content is higher than the stoichiometric proportion, transfer of oxygen from the oxide semiconductor layer 106 to the insulating film in contact therewith can be prevented and oxygen can be supplied from the insulating film in contact with the oxide semiconductor layer 106 to the oxide semiconductor layer 106.

As an oxide semiconductor for forming the oxide semiconductor layer 106, an intrinsic (i-type) or substantially intrinsic (i-type) oxide semiconductor obtained by removing impurities to highly purify the oxide semiconductor so that impurities which are carrier donors besides main components do not exist in the oxide semiconductor as much as possible, is used.

The oxide semiconductor layer 106 is in a single crystal state, a polycrystalline (also referred to as polycrystal) state, an amorphous state, or the like.

As the layer for the oxide semiconductor layer 106, for example, a layer containing at least one element selected from In, Ga, Sn, and Zn formed by a sputtering method or the like may be used. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

As the oxide semiconductor layer 106, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

When an In—Ga—Zn—O-based material is used as the oxide semiconductor, for example, an oxide semiconductor film formation target with a composition ratio of $In_2O_3$:$Ga_2O_3$:ZnO=1:1:1 [molar ratio] can be used. Note that it is not necessary to limit the material and the composition ratio of the target to the above. For example, an oxide semiconductor film formation target with a composition ratio of $In_2O_3$:$Ga_2O_3$:ZnO=1:1:2 [molar ratio] may be used.

In the case where an In—Zn—O-based material is used as the oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The oxide semiconductor layer 106 may be a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to an a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, variation in electric characteristics of the transistor due to irradiation with visible light or ultraviolet light can be reduced. Thus, the transistor has high reliability.

In the formation of the oxide semiconductor layer 106 by a sputtering method, the concentration of hydrogen contained in the oxide semiconductor layer 106 is preferably reduced as much as possible. In order to reduce the hydrogen concentration, a high-purity rare gas (typically argon), high-purity oxygen, or a high-purity mixed gas of a rare gas and oxygen, from which an impurity such as hydrogen, water, hydroxyl, or hydride is removed, is supplied into a treatment chamber of a sputtering apparatus as an atmosphere gas, as appropriate. Further, the treatment chamber may be evacuated with the use of a cryopump having high capability in evacuating water or a sputter ion pump having high capability in evacuating hydrogen.

After the oxide semiconductor layer 106 is formed, heat treatment (first heat treatment) is preferably performed on the oxide semiconductor layer 106. Excessive hydrogen (including water and hydroxyl) in the oxide semiconductor layer 106 can be removed by the first heat treatment. The first heat treatment is performed at a temperature of higher than or equal to 250° C. and lower than or equal to 700° C., preferably higher than or equal to 450° C. and lower than or equal to 600° C. The temperature of the first heat treatment is preferably lower than the strain point of the substrate 100.

The heat treatment can be performed in such a manner that, for example, an object to be processed is introduced into an electric furnace in which a resistance heating element or the like is used and heated at 450° C. for 1 hour in a nitrogen atmosphere. During the heat treatment, the oxide semiconductor layer 106 is not exposed to the air to prevent entry of water and hydrogen.

A heat treatment apparatus is not limited to an electric furnace, and may be an apparatus for heating an object to be processed by heat conduction or heat radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon, is used.

For example, as the first heat treatment, GRTA treatment may be performed as follows. An object to be processed is put in an inert gas atmosphere that has been heated, heated for several minutes, and taken out from the inert gas atmosphere. The GRTA treatment enables high-temperature heat treatment for a short time. Moreover, the GRTA treatment can be employed even when the temperature exceeds the upper temperature limit of the object to be processed.

Note that as the inert gas atmosphere, an atmosphere that contains nitrogen or a rare gas (such as helium, neon, or argon) as a main component and does not contain water, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the impurity concentration is lower than or equal to 1 ppm, preferably lower than or equal to 0.1 ppm).

The above heat treatment (first heat treatment) can be referred to as dehydration treatment, dehydrogenation treatment, or the like because of its effect of removing hydrogen, water, and the like. Such dehydration treatment or dehydrogenation treatment may be performed once or plural times. Note that an inert gas may be changed to a gas containing oxygen during the first heat treatment. Defect levels in an energy gap due to oxygen deficiency can be reduced by performing the first heat treatment in an atmosphere containing oxygen, so that the oxide semiconductor layer can be made closer to an i-type or substantially i-type oxide semiconductor layer.

Figure 2B:
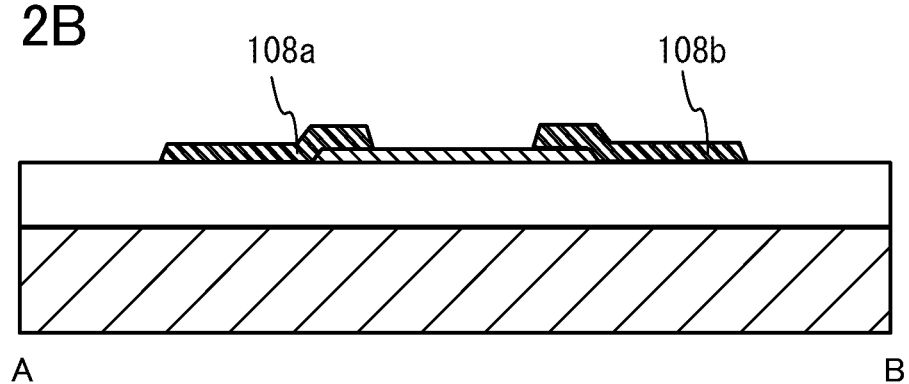

Next, a conductive film which is to be the source electrode layer and the drain electrode layer (including a wiring formed in the same layer as the source electrode layer and the drain electrode layer) is formed over the oxide semiconductor layer 106 and is processed, so that the source electrode layer 108*a* and the drain electrode layer 108*b* are formed (see FIG. 2B).

The conductive film used for the source electrode layer 108*a* and the drain electrode layer 108*b* is formed using a material that can withstand a heat treatment step performed later. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Further alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

Note that it is preferable that etching conditions be optimized so as not to etch and divide the oxide semiconductor layer 106 when the conductive film is etched. However, it is difficult to obtain etching conditions in which only the conductive film is etched and the oxide semiconductor layer 106 is not etched at all. In some cases, part of the oxide semiconductor layer 106 is etched off through the etching of the conductive film, so that an oxide semiconductor layer having a groove (depressed portion) is formed.

The channel length of the transistor, which is determined by a distance between the source electrode layer 108*a* and the drain electrode layer 108*b* which are adjacent to each other over the oxide semiconductor layer 106, is preferably less than or equal to 2 μm. In this embodiment, the channel length is 0.9 μm.

Figure 2C:
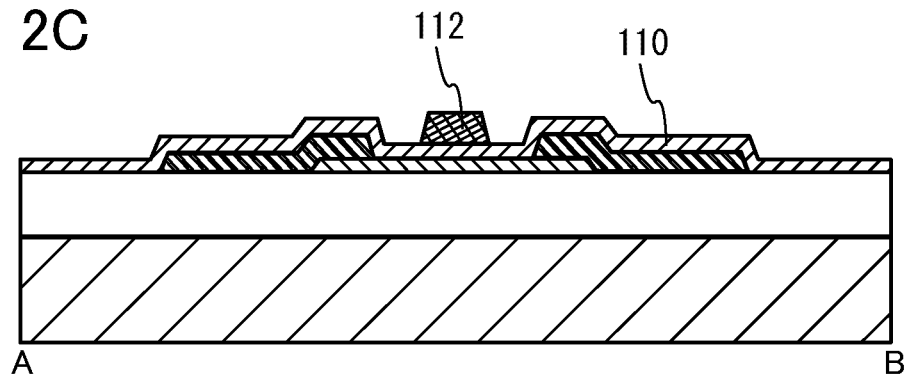

Next, the gate insulating film 110 which covers the source electrode layer 108*a* and the drain electrode layer 108*b* and is in contact with part of the oxide semiconductor layer 106 is formed (see FIG. 2C).

The gate insulating film 110 can be formed by a CVD method, a sputtering method, or the like. The gate insulating film 110 is preferably formed so as to contain silicon oxide, silicon nitride, silicon oxynitride, silicon nitride oxide, tantalum oxide, hafnium oxide, yttrium oxide, hafnium silicate (HfSi$_x$O$_y$ (x>0, y>0)), hafnium aluminate (HfAl$_x$O$_y$ (x>0, y>0)), hafnium silicate to which nitrogen is added, hafnium aluminate to which nitrogen is added, or the like. The gate insulating film 110 may have a single-layer structure or a stacked-layer structure using any of the above materials. There is no particular limitation on the thickness; however, in the case where a semiconductor device is miniaturized, the thickness is preferably small in order to ensure operation of the transistor. For example, in the case of using silicon oxynitride, the thickness can be greater than or equal to 1 nm and less than or equal to 100 nm, preferably greater than or equal to 10 nm and less than or equal to 50 nm.

When the gate insulating film is thin, gate leakage due to a tunnel effect or the like becomes a problem. In order to solve the problem of gate leakage, the gate insulating film 110 may be formed using a high dielectric constant (high-k) material such as hafnium oxide, tantalum oxide, yttrium oxide, hafnium silicate, hafnium aluminate, hafnium silicate to which nitrogen is added, or hafnium aluminate to which nitrogen is added. The use of a high-k material for the gate insulating film makes it possible to increase the thickness in order to suppress gate leakage as well as ensuring electric characteristics. Note that a stacked-layer structure of a film containing a high-k material and a film containing any one of silicon oxide, silicon nitride, silicon oxynitride, silicon nitride oxide, and the like may be employed.

The gate insulating film 110 can be formed to a thickness of at least 1 nm by a CVD method or the like as appropriate.

Next, a conductive film is formed over the gate insulating film 110 and subjected to a photolithography step, so that the gate electrode layer 112 is formed (see FIG. 2C).

The gate electrode layer 112 may be formed to have a single-layer structure or a stacked-layer structure using a metal material such as molybdenum, titanium, tantalum, tungsten, aluminum, copper, neodymium, or scandium, or an alloy material containing any of these materials as its main component by a plasma CVD method, a sputtering method, or the like.

Figure 3A:
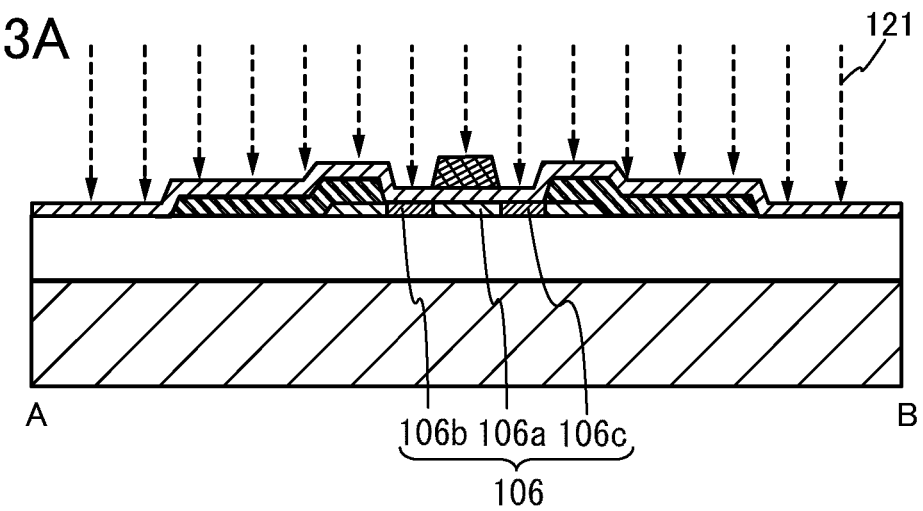
FIGS. 3A to 3C are cross-sectional views illustrating one embodiment of a method for manufacturing a semiconductor device.

Before the insulating film 114 is formed, treatment for adding an impurity element 121 to the oxide semiconductor layer 106 may be performed (see FIG. 3A).

As the impurity element 121 to be added, phosphorus, boron, argon, or the like is used. As a method for adding the impurity element 121 to the oxide semiconductor layer 106, an ion doping method or an ion implantation method can be used.

Note that an "ion doping method" refers to a method by which an object is irradiated with an ionized gas that is generated from a source gas and accelerated by an electric field without mass separation and an element of the ionized gas is included in the object. An "ion implantation method", also referred to as an ion-implanted method, is a method in which a source gas is made into plasma, ion species included in this plasma are extracted and mass-separated, ion species with predetermined mass are accelerated, and an object is irradiated with the accelerated ion species as an ion beam.

Note that the treatment for adding the impurity element 121 to the oxide semiconductor layer 106 may be performed plural times. In the case where the treatment for adding the impurity element 121 to the oxide semiconductor layer 106 is performed plural times, the kind of the impurity element 121 may be the same in the plural treatments or different in every treatment.

When the impurity element 121 is added to the oxide semiconductor layer 106, the gate electrode layer 112, the source electrode layer 108a, and the drain electrode layer 108b serve as masks, and the impurity element 121 is not added to the oxide semiconductor layer 106 in the region overlapping with the gate electrode layer 112, the source electrode layer 108a, or the drain electrode layer 108b, so that the first regions 106a are formed. In addition, the first region 106a overlapping with the gate electrode layer 112 serves as a channel formation region.

The second region 106b and the second region 106c to which the impurity element 121 is added become amorphous regions where crystallinity is decreased owing to damage by addition of the impurity element 121. By adjusting the additive amount of the impurity element 121 or the like, the degree of damage can be reduced so that the region is prevented from becoming completely amorphous. That is, the second region 106b and the second region 106c to which the impurity element 121 is added each have a proportion of an amorphous region higher than at least the first region 106a. It is preferable that the region be not completely amorphous because crystallization through heat treatment performed later can be easily performed.

A pair of second regions 106b and 106c functions as lightly doped drain (LDD) regions which have lower resistance than the first region 106a. The existence of the second regions 106b and 106c containing the impurity element 121 which function as the LDD regions can relax an electric field applied to an end portion of the first region 106a. Thus, a short-channel effect of the transistor can be suppressed.

In such a manner, the impurity element 121 is added to the oxide semiconductor layer 106 utilizing the gate electrode layer 112, the source electrode layer 108a, and the drain electrode layer 108b as masks and then the heat treatment is performed; thus, the first region 106a serving as a channel formation region and the pair of second regions 106b and 106c which are LDD regions can be formed in a self-aligned manner.

In this embodiment, phosphorus is added to the oxide semiconductor layer 106 as the impurity element 121 by an ion implantation method at an acceleration voltage of 25 kV to 40 kV and a dose of $1 \times 10^{15}$ ions/cm$^2$.

Figure 3B:
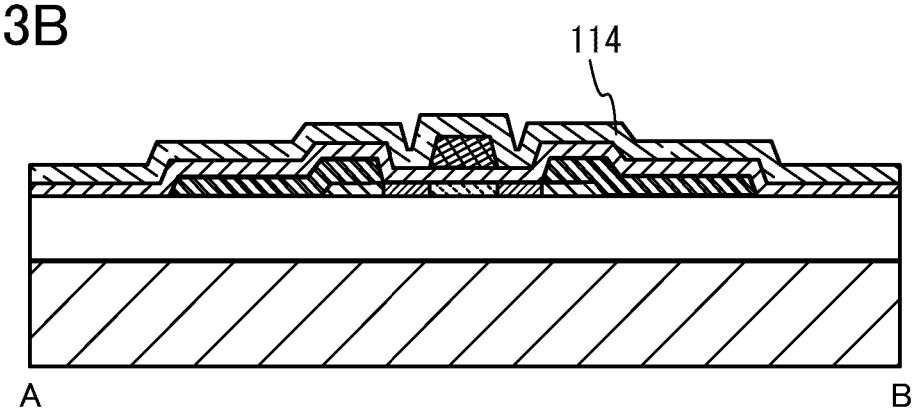

Next, the insulating film 114 which covers the gate electrode layer 112 and is in contact with the gate insulating film 110 is formed (see FIG. 3B).

An aluminum oxide film is used as the insulating film 114. Aluminum oxide has a barrier property and is less likely to transmit hydrogen, water, oxygen, and another impurity. Therefore, by providing an aluminum oxide film over the oxide semiconductor layer 106, the aluminum oxide film functions as a passivation film and prevents an impurity such as water from entering the oxide semiconductor layer 106 from the outside after completion of the device; thus, the oxide semiconductor layer 106 which is an i-type (intrinsic) or substantially i-type oxide semiconductor layer can be formed. In the case where a CAAC-OS film is used as the oxide semiconductor layer 106, microscopic defects of oxygen can be reduced and instability and moving of charge that are due to attachment and detachment of hydrogen atoms (including hydrogen ions) or alkali metal atoms can be reduced, so that the oxide semiconductor layer is more highly purified to become electrically i-type (intrinsic). Thus, a transistor with extremely excellent characteristics can be realized. Moreover, release of oxygen from the oxide semiconductor layer 106, the base insulating film 102, and the gate insulating film 110 can be prevented. For example, in the case of using an aluminum oxide film, the thickness can be greater than 50 nm and less than or equal to 500 nm, preferably greater than or equal to 70 nm and less than or equal to 200 nm. When the thickness of an aluminum oxide film is less than or equal to 50 nm, the aluminum oxide film does not function as a passivation film and cannot prevent impurities such as water from entering the oxide semiconductor layer 106 from the outside after completion of the device.

The insulating film 114 can be formed by a method by which an impurity such as water or hydrogen does not enter the insulating film 114, such as a sputtering method, as appropriate. When hydrogen is contained in the insulating film 114, hydrogen might enter the oxide semiconductor layer or extract oxygen in the oxide semiconductor layer, which cause variation in electric characteristics of the transistor including an oxide semiconductor. Therefore, it is important that a film formation method in which hydrogen is not used be employed in order to form the insulating film 114 containing as little hydrogen as possible. A high-purity gas from which an impurity such as hydrogen, water, hydroxyl, or hydride is removed is preferably used as a sputtering gas for forming the insulating film 114.

Note that the insulating film 114 includes an aluminum oxide film over and in contact with the gate insulating film 110 and the gate electrode layer 112, and a film containing another insulating material may be stacked over the aluminum oxide film.

Figure 3C:
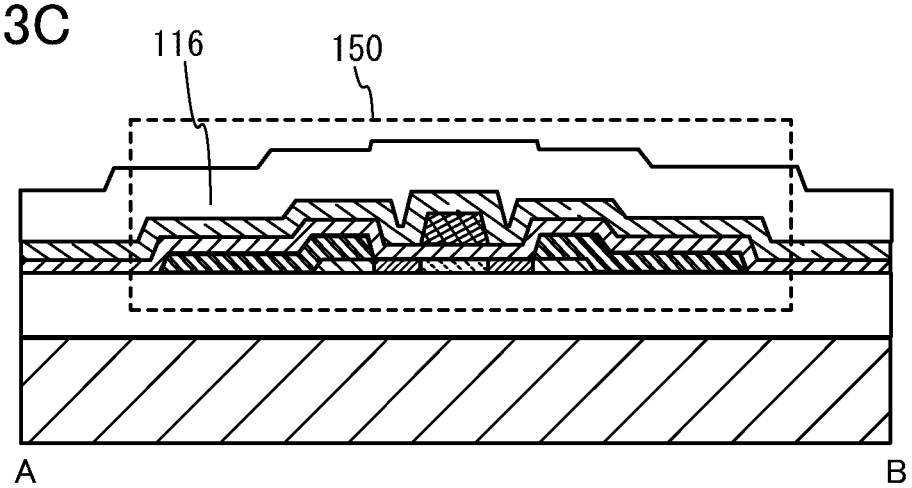

For example, the interlayer insulating film 116 may be formed over the aluminum oxide film (see FIG. 3C). For the interlayer insulating film 116, silicon oxynitride, silicon nitride oxide, polyimide, acrylic, or the like can be used.

In the case where after a transistor is formed, an electronic appliance or a semiconductor device using the transistor is manufactured, an interlayer film is formed and formation, processing, or the like of a variety of objects is performed over the interlayer film by heat treatment or the like. Therefore, in the completed transistor, entry of hydrogen or water into the oxide semiconductor layer or release of oxygen from the oxide semiconductor layer is caused by heat treatment or the like after the formation of the transistor, so that the electric characteristics of the transistor may vary. However, since an aluminum oxide film has a barrier function of not easily transmitting hydrogen, water, oxygen, and another impurity as described above, the aluminum oxide film is formed so as to be over and in contact with the gate insulating film and the gate electrode layer as described in this embodiment, whereby entry of hydrogen or water into the oxide semiconductor layer and release of oxygen from the oxide semiconductor layer can be prevented even when heat treatment or the like is performed after the transistor is formed.

For example, even in the case where hydrogen, water, or the like is contained in the interlayer insulating film 116 and heat treatment is performed in a manufacturing process of a semiconductor device or an electronic appliance after the transistor is formed, entry of hydrogen or water from the interlayer insulating film 116 to the oxide semiconductor layer 106 can be prevented by the formation of the aluminum oxide film over and in contact with the gate insulating film and the gate electrode layer.

Second heat treatment may be performed after the insulating film 114 or the interlayer insulating film 116 is formed. By the second heat treatment, the crystallinity of the second region 106b and the second region 106c to which the impurity element 121 is added is improved. In the case where a CAAC-OS film is used as the oxide semiconductor layer 106, by the second heat treatment, micro-defects in the film and defects at the interface with a stacked layer can be repaired; therefore, the oxide semiconductor layer 106 is more highly purified to become electrically i-type (intrinsic). The heat treatment is preferably performed at a temperature of higher than or equal to 350° C. and lower than or equal to 650° C., further preferably higher than or equal to 450° C. and lower than or equal to 650° C. The temperature of the second heat treatment is preferably lower than the strain point of the substrate. The heat treatment may be performed in an atmosphere of nitrogen, oxygen, ultra-dry air (air in which the water content is less than or equal to 20 ppm, preferably less than or equal to 1 ppm, more preferably less than or equal to 10 ppb), or a rare gas (such as argon or helium). Note that it is preferable that water, hydrogen, and the like be not contained in the atmosphere of nitrogen, oxygen, ultra-dry air, a rare gas, or the like. It is also preferable that the purity of nitrogen, oxygen, or a rare gas which is introduced into a heat treatment apparatus be set to be higher than or equal to 6N (99.9999%), preferably higher than or equal to 7N (99.99999%) (that is, the impurity concentration is lower than or equal to 1 ppm, preferably lower than or equal to 0.1 ppm).

Although the timing of the second heat treatment is not limited to those in this embodiment, the heat treatment needs to be performed at least after the insulating film 114 is formed. This is because, since the aluminum oxide film used as the insulating film 114 has a high blocking effect and thus is less likely to transmit both oxygen and impurities such as hydrogen and water, release of oxygen from the oxide semiconductor layer 106 can be prevented by performing the heat treatment after the insulating film 114 is formed.

Through the above steps, the transistor 150 including the oxide semiconductor layer 106 in which formation of oxygen defects is suppressed is formed. The oxide semiconductor layer, the source electrode layer, the drain electrode layer, the gate insulating film, and the gate electrode layer are formed in this order, and then the aluminum oxide film is formed over and in contact with the gate insulating film and the gate electrode layer, whereby water or hydrogen can be prevented from entering and diffusing into the oxide semiconductor layer from the air even when heat treatment is performed in a manufacturing process of a semiconductor device or an electronic appliance including the transistor 150. In the transistor 150, by the second heat treatment, oxygen is supplied to the oxide semiconductor layer 106 from the base insulating film 102 or the gate insulating film 110 including a region in which the oxygen content is higher than the stoichiometric proportion, so that oxygen deficiency in the oxide semiconductor layer 106 can be compensated. Therefore, variation in the electric characteristics of the transistor 150 is suppressed and the transistor 150 is electrically stable.

Further, the transistor 150 is preferably subjected to heat treatment for dehydration or dehydrogenation, and can be a transistor including the oxide semiconductor layer 106 from which an impurity such as hydrogen, water, hydroxyl, or hydride (also referred to as a hydrogen compound) is intentionally removed by the heat treatment, which is highly purified, and which is made to be electrically i-type (intrinsic). The number of carriers in the highly purified oxide semiconductor layer 106 is significantly small (close to zero).

When the aluminum oxide film is formed over the oxide semiconductor layer, variation in the electric characteristics of the transistor is suppressed and the transistor is electrically stable. Therefore, the on/off ratio can be ensured and normal switching characteristics are obtained even in a miniaturized transistor, and a transistor having favorable electric characteristics can be provided.

As described above, according to this embodiment, a semiconductor device which includes an oxide semiconductor and has stable electric characteristics can be provided. Further, a semiconductor device having high reliability can be provided.

The structures, methods, and the like described in this embodiment can be combined as appropriate with any of structures, the methods, and the like described in the other embodiments.

Embodiment 2

A semiconductor device having a display function (also referred to as a display device) can be manufactured using the transistor exemplified in Embodiment 1. Moreover, part or all of a driver circuit which includes the transistor can be formed over a substrate where a pixel portion is formed, whereby a system-on-panel can be obtained.

Figure 4A:
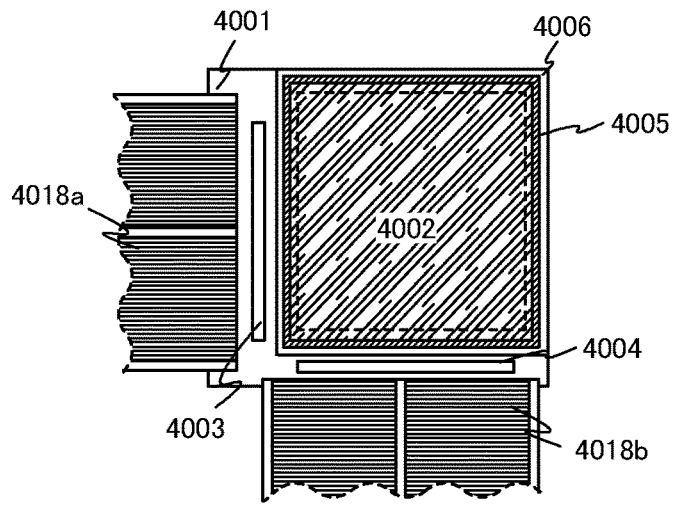
FIGS. 4A to 4C each illustrate one embodiment of a semiconductor device.

In FIG. 4A, a sealant 4005 is provided so as to surround a pixel portion 4002 provided over a first substrate 4001, and the pixel portion 4002 is sealed by using a second substrate 4006. In FIG. 4A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potentials are supplied to the signal line driver circuit 4003 and the scan line driver circuit 4004 which are separately formed and the pixel portion 4002 from flexible printed circuits (FPCs) 4018a and 4018b.

Figure 4B:
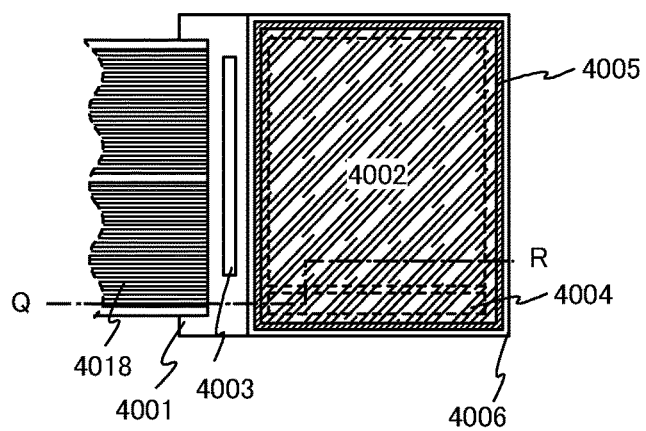
Figure 4C:
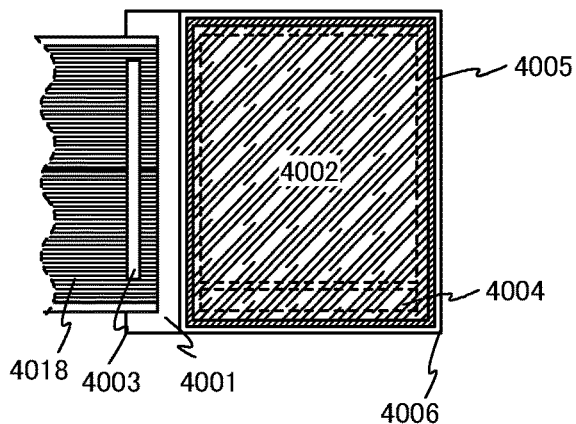

In FIGS. 4B and 4C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 4B and 4C, the signal line driver circuit 4003 which is formed using a single crystal semiconductor film or a polycrystalline semiconductor film over a substrate prepared separately is mounted in a region that is different from the region surrounded by the sealant 4005 over the first substrate 4001. In FIGS. 4B and 4C, various signals and potential are supplied to the signal line driver circuit 4003 which is separately formed, the scan line driver circuit 4004, and the pixel portion 4002 from an FPC 4018.

Although FIGS. 4B and 4C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 4A illustrates an example in which the signal line driver circuit 4003 and the scan line driver circuit 4004 are mounted by a COG method. FIG. 4B illustrates an example in which the signal line driver circuit 4003 is mounted by a COG method. FIG. 4C illustrates an example in which the signal line driver circuit 4003 is mounted by a TAB method.

In addition, the display device includes a panel in which the display element is sealed, and a module in which an IC or the like including a controller is mounted on the panel.

Note that the display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion 4002 and the scan line driver circuit 4004 provided over the first substrate 4001 include a plurality of transistors, and the transistor described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 5:
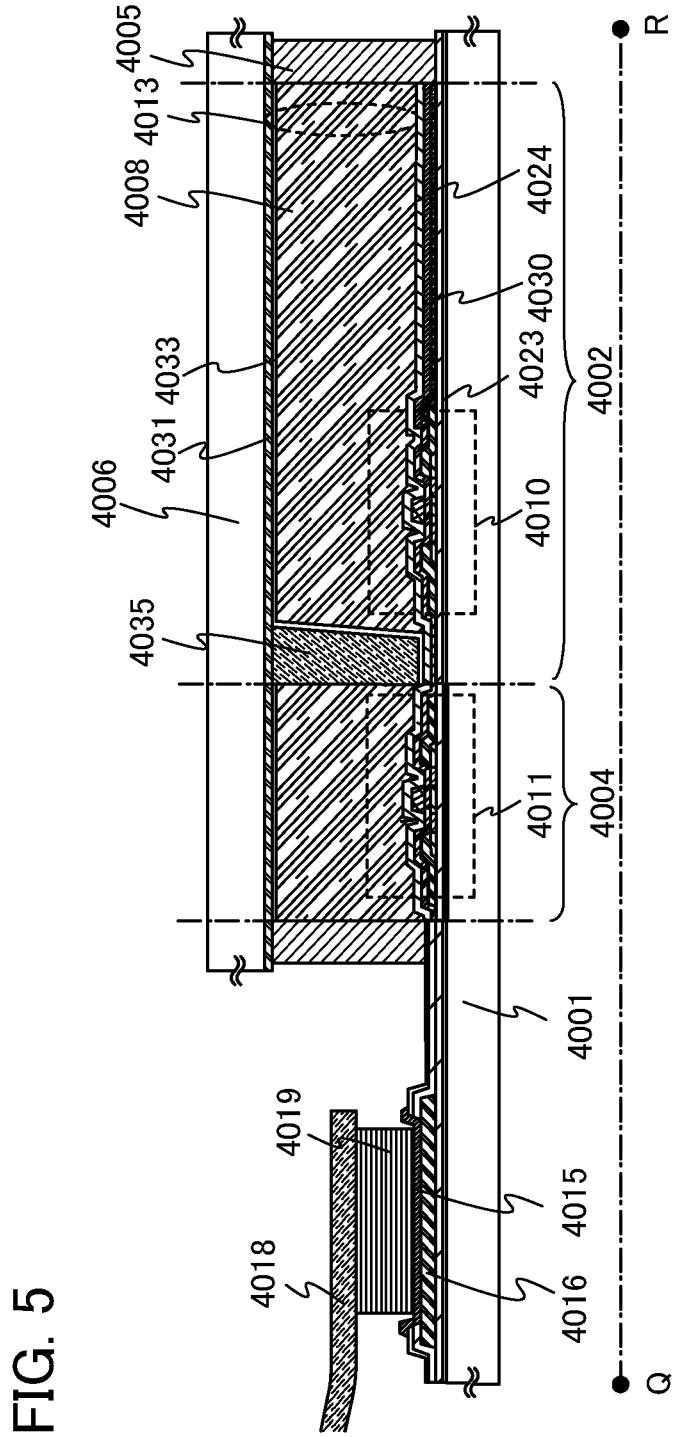
FIG. 5 illustrates one embodiment of a semiconductor device.
Figure 6:
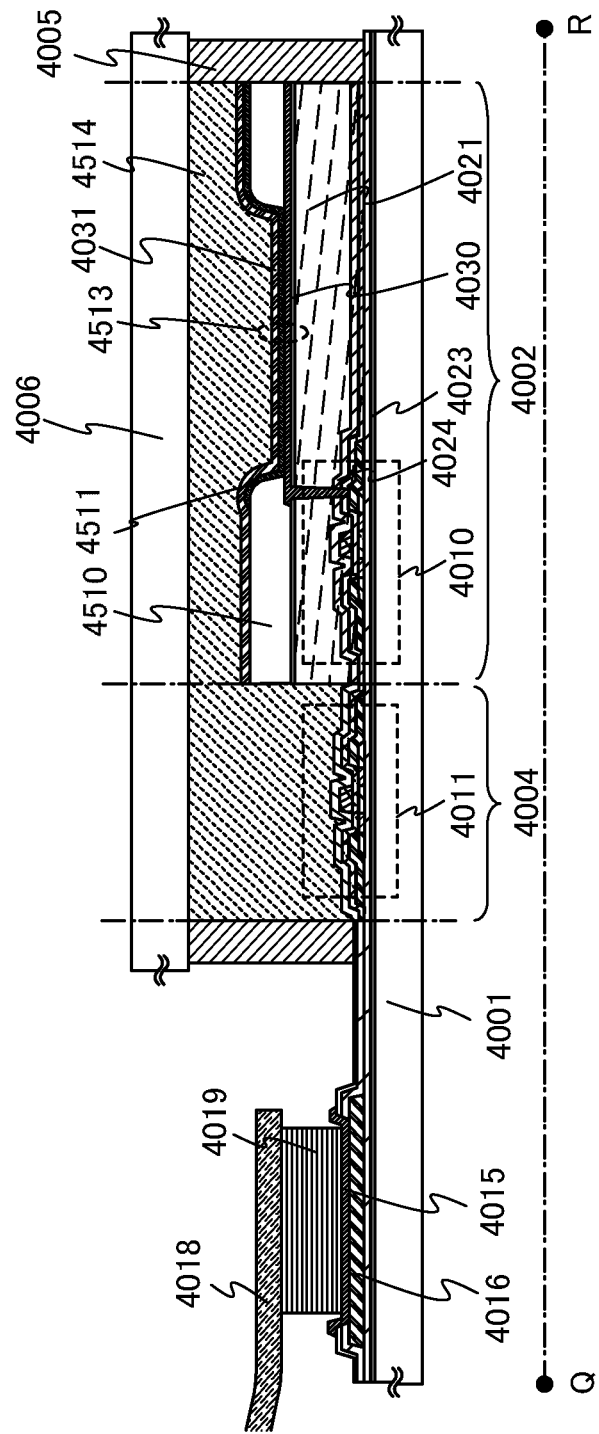
FIG. 6 illustrates one embodiment of a semiconductor device.
Figure 7:
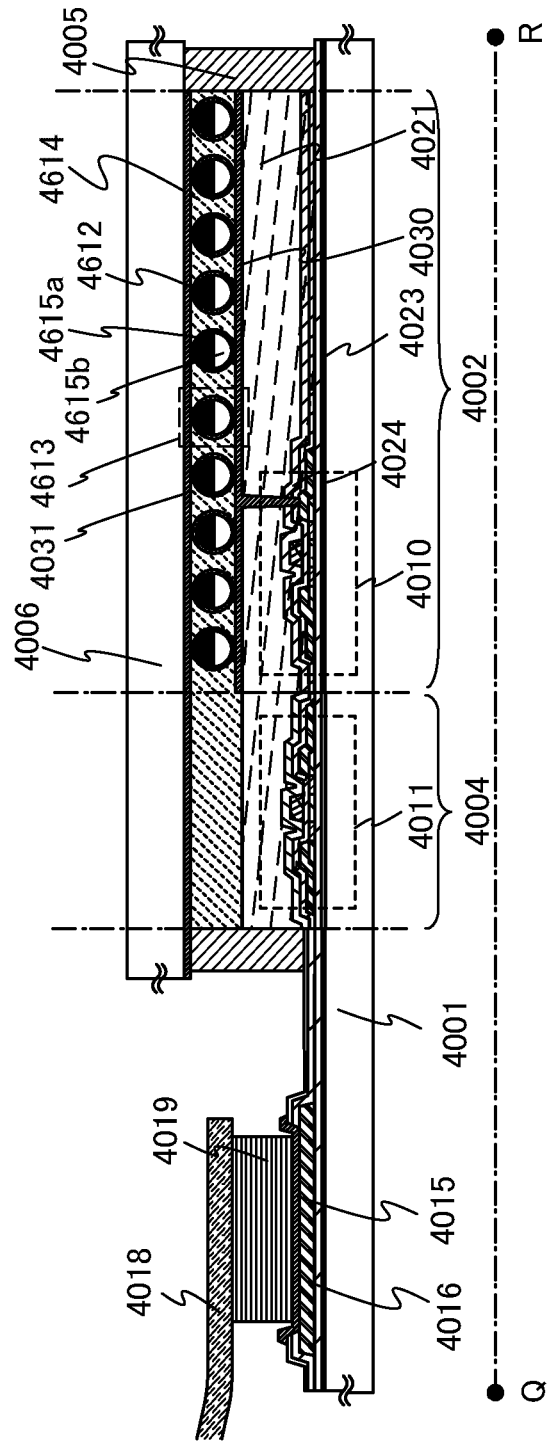
FIG. 7 illustrates one embodiment of a semiconductor device.

One embodiment of the semiconductor device is described with reference to FIG. 5, FIG. 6, and FIG. 7. FIG. 5, FIG. 6, and FIG. 7 correspond to cross-sectional views taken along line Q-R in FIG. 4B.

As illustrated in FIG. 5, FIG. 6, and FIG. 7, the semiconductor device includes a connection terminal electrode layer 4015 and a terminal electrode layer 4016. The connection terminal electrode layer 4015 and the terminal electrode layer 4016 are electrically connected to a terminal included in the FPC 4018 through an anisotropic conductive film 4019.

The connection terminal electrode layer 4015 is formed using the same conductive film as a first electrode layer 4030, and the terminal electrode layer 4016 is formed using the same conductive film as source and drain electrode layers of a transistor 4010 and a transistor 4011.

The pixel portion 4002 and the scan line driver circuit 4004 which are provided over the first substrate 4001 include a plurality of transistors. In FIG. 5, FIG. 6, and FIG. 7, the transistor 4010 included in the pixel portion 4002 and the transistor 4011 included in the scan line driver circuit 4004 are illustrated as an example. In FIG. 5, an insulating film 4024 is provided over the transistors 4010 and 4011, and in FIG. 6 and FIG. 7, an insulating film 4021 is further provided. Note that an insulating film 4023 over the first substrate 4001 is an insulating film serving as a base film.

In this embodiment, the transistor described in Embodiment 1 can be applied to the transistor 4010 and the transistor 4011.

The transistor 4010 and the transistor 4011 are each a transistor including an oxide semiconductor layer in which formation of oxygen deficiency and entry of water or hydrogen are suppressed. Therefore, variation in the electric characteristics of the transistors 4010 and 4011 is suppressed and the transistors 4010 and 4011 are electrically stable.

As described above, highly reliable semiconductor devices can be provided as the semiconductor devices of this embodiment illustrated in FIG. 5, FIG. 6, and FIG. 7.

The transistor 4010 provided in the pixel portion 4002 is electrically connected to a display element to form a display panel. A variety of display elements can be used as the display element as long as display can be performed.

An example of a liquid crystal display device using a liquid crystal element as a display element is described in FIG. 5. In FIG. 5, a liquid crystal element 4013 which is a display element includes the first electrode layer 4030, a second electrode layer 4031, and a liquid crystal layer 4008. The insulating film 4024 and an insulating film 4033 which function as alignment films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A columnar spacer 4035 is obtained by selective etching of an insulating film and is provided in order to control the thickness (a cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal showing a blue phase and a chiral agent has a short response time, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor that includes an oxide semiconductor layer has a possibility that the electric characteristics may vary significantly by the influence of static electricity and deviate from the designed range. Therefore, it is more effective to use a liquid crystal material exhibiting a blue phase for a liquid crystal display device including a transistor which includes an oxide semiconductor layer.

The specific resistivity of the liquid crystal material is $1\times10^9$ $\Omega\cdot$cm or more, preferably $1\times10^{11}$ $\Omega\cdot$cm or more, more preferably $1\times10^{12}$ $\Omega\cdot$cm or more. The value of the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current or the like of the transistor. By using the transistor including the oxide semiconductor layer which includes an oxygen-excessive region, it is enough to provide a storage capacitor having a capacitance that is ⅓ or less, preferably ⅕ or less of a liquid crystal capacitance of each pixel.

In the transistor used in this embodiment, which includes an oxide semiconductor layer in which formation of oxygen deficiency is suppressed, the current in an off state (the off-state current) can be made small. Accordingly, an electrical signal such as an image signal can be held for a long period, and a writing interval can be set long in an on state. Accordingly, the frequency of refresh operation can be reduced, which leads to an effect of suppressing power consumption.

The transistor used in this embodiment, which includes an oxide semiconductor layer in which formation of oxygen deficiency is suppressed, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors of R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of the color elements. The disclosed invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified depending on whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified depending on the element structure into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of a pair of electrodes has a light-transmitting property. The transistor and the light-emitting element are provided over the substrate. The light-emitting element can have any of the following structures: a top emission structure in which light is extracted through the surface opposite to the substrate; a bottom emission structure in which light is extracted through the surface on the substrate side; or a dual emission structure in which light is extracted through the surface opposite to the substrate and the surface on the substrate side.

An example of a light-emitting device in which a light-emitting element is used as a display element is illustrated in FIG. 6. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 6. The structure of the light-emitting element 4513 can be changed as appropriate depending on a direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode layer 4030 so that a sidewall of the opening has a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, water, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate for a light-emitting surface of the light-emitting element. Further, the polarizing plate or the circularly polarizing plate may be provided with an anti-reflection film. For example, anti-glare treatment by which reflected light can be diffused by surface roughness so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (one of which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 7 illustrates active matrix electronic paper as one embodiment of a semiconductor device. The electronic paper in FIG. 7 is an example of a display device using a twisting ball display system.

Between the first electrode layer 4030 connected to the transistor 4010 and the second electrode layer 4031 provided for the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode layer (counter electrode layer). The second electrode layer 4031 is electrically connected to a common potential line.

Note that in FIG. 5, FIG. 6, and FIG. 7, a flexible substrate as well as a glass substrate can be used as the first substrate 4001 and the second substrate 4006. For example, a plastic substrate having a light-transmitting property can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

In this embodiment, a silicon oxide film is used as the insulating film 4023, and an aluminum oxide film is used as the insulating film 4024. The insulating film 4023 and the insulating film 4024 can be formed by a sputtering method or a plasma CVD method.

The aluminum oxide film provided as the insulating film 4024 over the oxide semiconductor layer has a high blocking effect and thus is less likely to transmit both oxygen and an impurity such as hydrogen or water.

Therefore, during the manufacturing process and after the manufacture, the aluminum oxide film functions as a protective film for preventing entry of an impurity such as hydrogen or water, which can cause variation, into the oxide semiconductor layer and release of oxygen, which is a main component material of the oxide semiconductor, from the oxide semiconductor layer.

The silicon oxide film provided as the insulating film 4023 in contact with the oxide semiconductor layer has a function of supplying oxygen to the oxide semiconductor layer. Therefore, the insulating film 4023 is preferably an oxide insulating film containing much oxygen.

The transistor 4010 and the transistor 4011 each include an oxide semiconductor layer in which formation of oxygen deficiency and entry of water or hydrogen are suppressed. In addition, the transistor 4010 and the transistor 4011 each include a silicon oxide film as a gate insulating film. The oxide semiconductor layers included in the transistor 4010 and the transistor 4011 are subjected to heat treatment in a state where the aluminum oxide film is provided as the insulating film 4024 over the oxide semiconductor layer; therefore, oxygen can be prevented from being released from the oxide semiconductor layer by the heat treatment. Accordingly, the obtained oxide semiconductor layer can be a film which includes a region containing more oxygen than the stoichiometric proportion.

The oxide semiconductor layer included in each of the transistor 4010 and the transistor 4011 has high purity because an impurity such as hydrogen or water is not mixed therein, and includes the region containing excess oxygen as compared to a stoichiometric proportion of an oxide semiconductor in a crystalline state because oxygen is prevented from being released. Accordingly, by using the oxide semiconductor layer for each of the transistor 4010 and the transistor 4011, variation in the threshold voltage Vth of the transistors due to oxygen deficiency and a shift of the threshold voltage $\Delta$Vth can be reduced.

The insulating film 4021 serving as a planarizing insulating film can be formed using an organic material having heat resistance, such as acrylic, polyimide, benzocyclobutene, polyamide, or epoxy. As well as such organic materials, it is possible to use a low-dielectric constant material (a low-k material), a siloxane-based resin, phosphosilicate glass (PSG), borophosphosilicate glass (BPSG), or the like. The insulating film may be formed by stacking a plurality of insulating films formed of these materials.

There is no particular limitation on the method for forming the insulating film 4021, and the insulating film 4021 can be formed, depending on the material, by a sputtering method, an SOG method, a spin coating method, a dipping method, a spray coating method, a droplet discharge method (e.g., an inkjet method), a printing method (e.g., a screen printing method or an offset printing method), or with a tool (equipment) such as a doctor knife, a roll coater, a curtain coater, or a knife coater.

The display device displays an image by transmitting light from a light source or a display element. Therefore, the substrate and the thin films such as the insulating film and the conductive film provided for the pixel portion where light is transmitted all have a light-transmitting property with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or graphene.

The first electrode layer 4030 and the second electrode layer 4031 can be formed of one or more kinds using materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these materials; and nitrides of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken owing to static electricity or the like, a protective circuit for protecting the driver circuit is preferably provided. The protective circuit is preferably formed using a non-linear element.

As described above, the aluminum oxide film is formed over the oxide semiconductor layer, whereby water or hydrogen can be prevented from entering and diffusing into the oxide semiconductor layer from the air even when heat treatment is performed in a manufacturing process of a semiconductor device having a display function using the transistors. Therefore, variation in the electric characteristics of the transistors is suppressed and the transistors are electrically stable. Thus, by using the transistors, a highly reliable semiconductor device can be provided.

This embodiment can be implemented in appropriate combination with any of the structures described in the other embodiments.

Embodiment 3

A semiconductor device having an image sensor function for reading data of an object can be manufactured with the use of the transistor described in Embodiment 1.

Figure 8A:
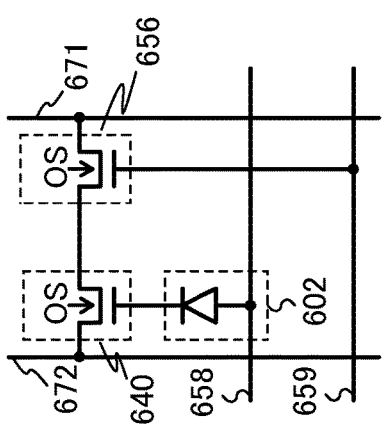
FIGS. 8A and 8B illustrate one embodiment of a semiconductor device.

An example of a semiconductor device having an image sensor function is illustrated in FIG. 8A. FIG. 8A illustrates an equivalent circuit of a photo sensor, and FIG. 8B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor layer is denoted by a symbol "OS" so that it can be identified as a transistor including an oxide semiconductor layer. The transistor 640 and the transistor 656 in FIG. 8A are transistors each including an oxide semiconductor layer in which formation of oxygen defects is suppressed, as described in Embodiment 1.

Figure 8B:
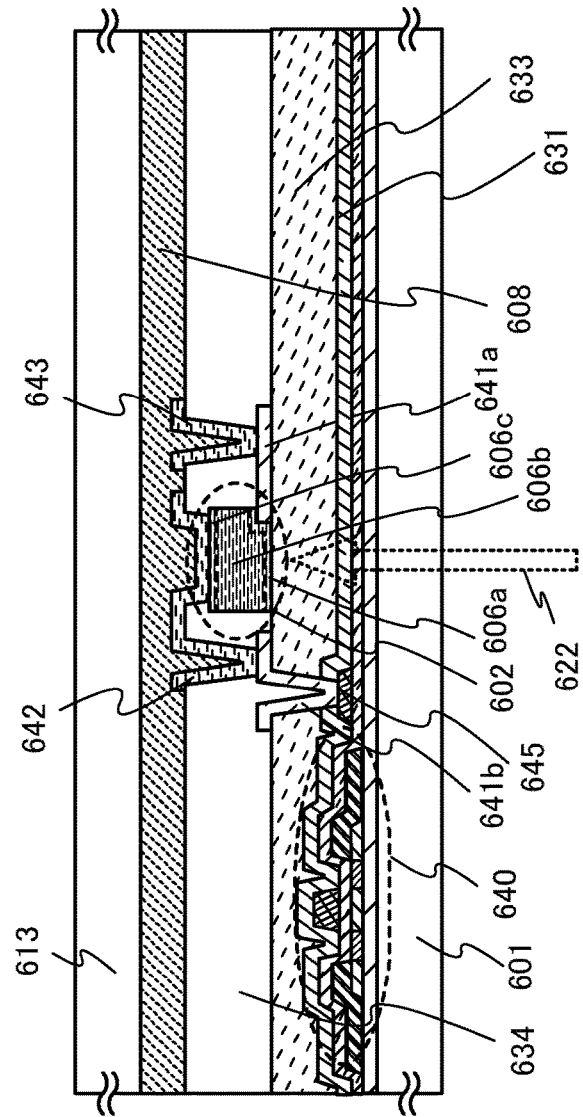

FIG. 8B is a cross-sectional view of the photodiode 602 and the transistor 640 in the photo sensor. The photodiode 602 serving as a sensor and the transistor 640 are provided over a substrate 601 (a TFT substrate) having an insulating surface. A substrate 613 is provided over the photodiode 602 and the transistor 640 with an adhesive layer 608 provided therebetween.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between the electrode layer 641a formed over the interlayer insulating film 633 and the electrode layer 642 formed over the interlayer insulating film 634.

The electrode layer 641a is electrically connected to a conductive layer 643 formed over the interlayer insulating film 634, and the electrode layer 642 is electrically connected to a gate electrode layer 645 through the electrode layer 641b. The gate electrode layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion implantation method. Heating or the like may be conducted after introducing the impurity element by an ion implantation method or the like in order to diffuse the impurity element. In that case, as a method for forming the amorphous silicon film, an LPCVD method, a chemical vapor deposition method, a sputtering method, or the like may be used. The first semiconductor film 606a is preferably formed to have a thickness of greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness of greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion implantation method. Heating or the like may be conducted after introducing the impurity element by an ion injecting method or the like in order to diffuse the impurity element. In that case, as a method for forming the amorphous silicon film, an LPCVD method, a chemical vapor deposition method, a sputtering method, or the like may be used. The third semiconductor film 606c is preferably formed to have a thickness of greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (a semi-amorphous semiconductor: SAS).

The microcrystalline semiconductor belongs to a metastable state of an intermediate between amorphous and single crystalline when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. The semiconductor contains hydrogen or halogen of at least 1 at. % to terminate a dangling bond. Moreover, microcrystalline silicon is made to contain a rare gas element such as helium, argon, krypton, or neon to further enhance lattice distortion, whereby stability is increased and a favorable microcrystalline semiconductor film can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed by using a gas obtained by diluting silicon hydride such as $SiH_4$, $Si_2H_6$, $SiH_2Cl_2$, $SiHCl_3$, $SiCl_4$, or $SiF_4$ with hydrogen. Further, with a dilution with one or plural kinds of rare gas elements selected from helium, argon, krypton, and neon in addition to silicon hydride and hydrogen, the microcrystalline semiconductor film can be formed. In that case, the flow ratio of hydrogen to silicon hydride is 5:1 to 200:1, preferably 50:1 to 150:1, more preferably 100:1. Further, a carbide gas such as $CH_4$ or $C_2H_6$, a germanium gas such as $GeH_4$ or $GeF_4$, $F_2$, or the like may be mixed into the gas containing silicon.

In addition, since the mobility of holes generated by a photoelectric effect is lower than that of electrons, a pin photodiode has better characteristics when a surface on the p-type semiconductor film side is used as a light-receiving plane. Here, an example in which light 622 received by the photodiode 602 from a surface of the substrate 601, over which the pin photodiode is formed, is converted into electric signals will be described. Further, light from the semiconductor film having a conductivity type opposite to that of the semiconductor film on the light-receiving plane is disturbance light; therefore, the electrode layer on the semiconductor film having the opposite conductivity type is preferably formed using a light-blocking conductive film. Note that a surface on the n-type semiconductor film side can alternatively be used as the light-receiving plane.

With the use of an insulating material, the interlayer insulating film 633 and the interlayer insulating film 634 can be formed, depending on the material, by a sputtering method, a plasma CVD method, an SOG method, a spin coating method, a dipping method, a spray coating method, a droplet discharge method (e.g., an inkjet method), a printing method (e.g., a screen printing method or an offset printing method), or with a tool (equipment) such as a doctor knife, a roll coater, a curtain coater, or a knife coater.

In this embodiment, an aluminum oxide film is used as the insulating film 631. The insulating film 631 can be formed by a sputtering method or a plasma CVD method.

The aluminum oxide film provided as the insulating film 631 over the oxide semiconductor layer has a high blocking effect and thus is less likely to transmit both oxygen and an impurity such as hydrogen or water.

Therefore, during the manufacturing process and after the manufacture, the aluminum oxide film functions as a protective film for preventing entry of an impurity such as hydrogen or water, which can cause variation, into the oxide semiconductor layer and release of oxygen, which is a main component material of the oxide semiconductor, from the oxide semiconductor layer.

In this embodiment, the transistor 640 includes an oxide semiconductor layer in which formation of oxygen deficiency and entry of an impurity such as water or hydrogen are suppressed. In addition, the transistor 640 includes a silicon oxide film as a gate insulating film. The oxide semiconductor layer included in the transistor 640 is subjected to heat treatment in a state where the aluminum oxide film is provided as the insulating film 631 over the oxide semiconductor layer; therefore, oxygen can be prevented from being released from the oxide semiconductor layer by the heat treatment.

The oxide semiconductor layer included in the transistor 640 has high purity because an impurity such as hydrogen or water is not mixed therein, and oxygen defects can be reduced because oxygen is prevented from being released. Accordingly, by using the oxide semiconductor layer for the transistor 640, variation in the threshold voltage Vth of the transistor due to oxygen deficiency and a shift of the threshold voltage ΔVth can be reduced.

The interlayer insulating film 633 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

For reduction of the surface roughness, an insulating film serving as a planarizing insulating film is preferably used as the interlayer insulating film 634. The interlayer insulating film 633 and the interlayer insulating film 634 can be formed using, for example, an organic insulating material such as polyimide, an acrylic resin, a benzocyclobutene-based resin, polyamide, or an epoxy resin. As well as such organic insulating materials, it is possible to use a single layer or stacked layers of a low-dielectric constant material (a low-k material), a siloxane-based resin, phosphosilicate glass (PSG), borophosphosilicate glass (BPSG), or the like.

When the light 622 that enters the photodiode 602 is detected, data on an object to be detected can be read. Note that a light source such as a backlight can be used at the time of reading data on the object.

As described above, the aluminum oxide film is formed over the oxide semiconductor layer, whereby water or hydrogen can be prevented from entering and diffusing into the oxide semiconductor layer from the air even when heat treatment is performed in a manufacturing process of a semiconductor device having an image sensor function for reading data of an object. Therefore, variation in the electric characteristics of the transistors is suppressed and the transistors are electrically stable. Thus, by using the transistor, a highly reliable semiconductor device can be provided.

This embodiment can be implemented in appropriate combination with any of the structures described in the other embodiments.

Embodiment 4

The transistor described in Embodiment 1 can be favorably used for a semiconductor device including an integrated circuit in which a plurality of transistors is stacked. In this embodiment, as an example of the semiconductor device, a memory medium (memory element) will be described.

In this embodiment, a semiconductor device including a first transistor which is formed using a single crystal semiconductor substrate and a second transistor which is formed using a semiconductor film and is provided above the first transistor with an insulating film positioned between the first transistor and the second transistor is manufactured.

Figure 9A:
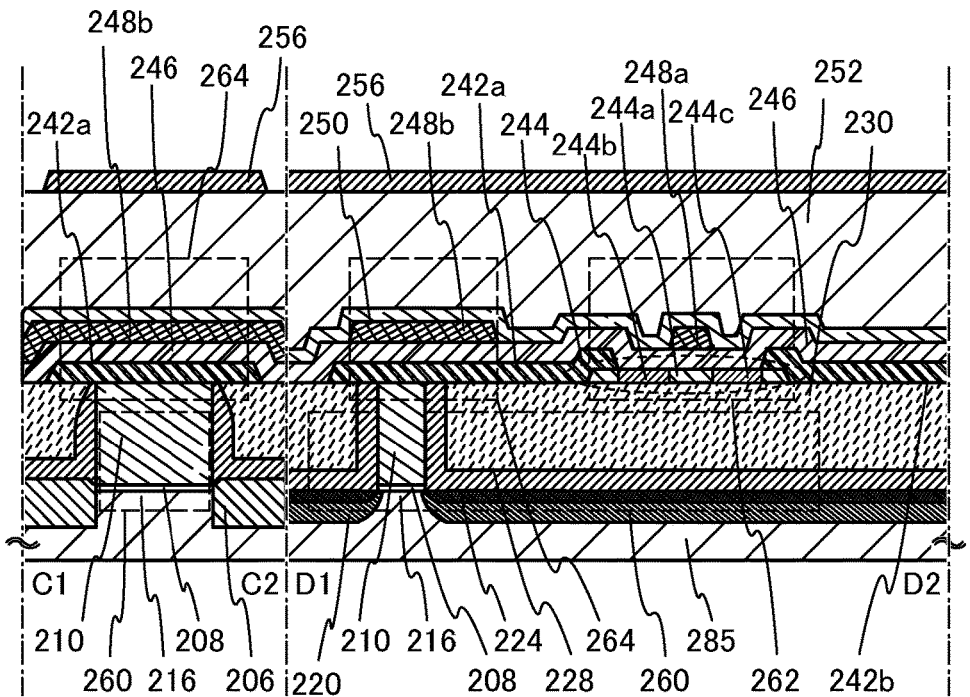
FIGS. 9A to 9C illustrate one embodiment of a semiconductor device.
Figure 9B:
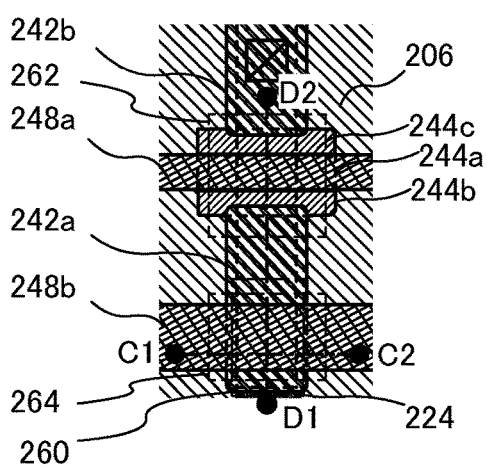
Figure 9C:
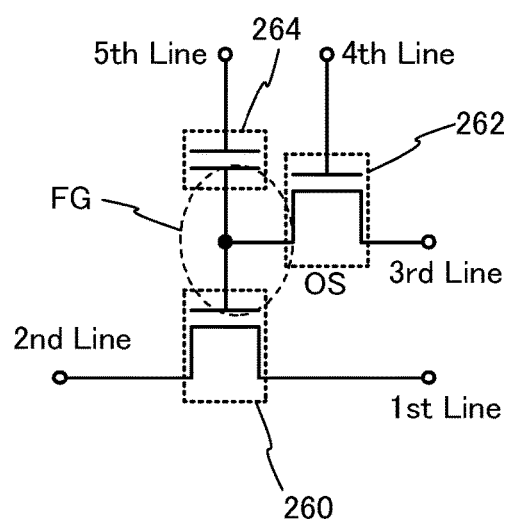

FIGS. 9A to 9C illustrate an example of a structure of a semiconductor device. FIG. 9A is a cross-sectional view of the semiconductor device, and FIG. 9B is a plan view of the semiconductor device. Here, FIG. 9A corresponds to a cross-sectional view taken along lines $C_1$-$C_2$ and D1-D2 of FIG. 9B. In addition, FIG. 9C illustrates an example of a diagram of a circuit including the semiconductor device as a memory element.

The semiconductor device illustrated in FIGS. 9A and 9B includes a transistor 260 formed using a first semiconductor material in a lower portion, and a transistor 262 formed using a second semiconductor material in an upper portion. The transistor described in Embodiment 1 can be favorably used as the transistor 262. In this embodiment, an example in which a transistor having a structure similar to that of the transistor 150 described in Embodiment 1 is used as the transistor 262 will be described.

Semiconductor materials and structures of the transistor 260 and the transistor 262, which are stacked, may be the same or different. In this embodiment, an example is described in which materials and structures which are appropriate for the circuit of the memory medium (memory element) are employed for the transistors; here, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, or gallium arsenide can be used, and a single crystal semiconductor is preferably used. Alternatively, an organic semiconductor material or the like may be used. A transistor formed using such a semiconductor material can operate at high speed easily. On the other hand, a transistor formed using an oxide semiconductor can hold charge for a long time owing to its characteristics.

The transistor 260 includes a channel formation region 216 provided in a substrate 285 including a semiconductor material (e.g., silicon), impurity regions 220 provided so as to sandwich the channel formation region 216, metal compound regions 224 in contact with the impurity regions 220, a gate insulating film 208 provided over the channel formation region 216, and a gate electrode layer 210 provided over the gate insulating film 208.

As the substrate 285 including a semiconductor material, a single crystal semiconductor substrate or a polycrystalline semiconductor substrate of silicon, silicon carbide, or the like, a compound semiconductor substrate of silicon germanium or the like, an SOI substrate, or the like can be used. Note that although the term "SOI substrate" generally means a substrate in which a silicon semiconductor film is provided over an insulating surface, the term "SOI substrate" in this specification and the like also includes a substrate in which a semiconductor film including a material other than silicon is provided over an insulating surface. In other words, a semiconductor film included in the "SOI substrate" is not limited to a silicon semiconductor film. Moreover, the SOI substrate can be a substrate in which a semiconductor film is provided over an insulating substrate such as a glass substrate with an insulating film provided therebetween.

As a method for forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect generated in the surface layer is eliminated; a method in which a semiconductor substrate is separated by utilizing a phenomenon in which microvoids formed by hydrogen ion irradiation grow because of heat treatment; a method in which a single crystal semiconductor film is formed over an insulating surface by crystal growth; and the like.

For example, ions are added through one surface of a single crystal semiconductor substrate, an embrittlement layer is formed at a certain depth from the surface of the single crystal semiconductor substrate, and an insulating film is formed over one of the surface of the single crystal semiconductor substrate and an element substrate. Heat treatment is performed in a state where the single crystal semiconductor substrate and the element substrate are bonded to each other with the insulating film interposed therebetween, so that a crack is generated in the embrittlement layer and the single crystal semiconductor substrate is separated along the embrittlement layer. Accordingly, a single crystal semiconductor film, which is separated from the single crystal semiconductor substrate, is formed as a semiconductor film over the element substrate. An SOI substrate formed by the above method can also be favorably used.

An element isolation insulating film 206 is provided over the substrate 285 so as to surround the transistor 260. Note that for high integration, it is preferable that, as illustrated in FIG. 9A, the transistor 260 does not have a sidewall insulating film. On the other hand, in the case where the characteristics of the transistor 260 have priority, sidewall insulating films may be provided on side surfaces of the gate electrode layer 210, and the impurity regions 220 may each include a region with a different impurity concentration.

The transistor 260 formed using a single crystal semiconductor substrate can operate at high speed. Thus, when the transistor is used as a reading transistor, data can be read at high speed.

In this embodiment, two insulating films are provided so as to cover the transistor 260. Note that the insulating film which covers the transistor 260 may have a single-layer structure or a stacked-layer structure of three or more layers. Note also that a silicon oxide film is used as an insulating film in contact with an oxide semiconductor layer included in the transistor 262 which is provided in the upper portion.

As treatment prior to formation of the transistor 262 and a capacitor 264, CMP treatment is performed on the two insulating films, whereby an insulating film 228 and an insulating film 230 which are planarized are formed and, at the same time, an upper surface of the gate electrode layer 210 is exposed.

As each of the insulating film 228 and the insulating film 230, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating film 228 and the insulating film 230 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (low-k material) or the like. In the case of using an organic material, the insulating film 228 and the insulating film 230 may be formed by a wet method such as a spin coating method or a printing method.

In this embodiment, a 50-nm-thick silicon oxynitride film is formed as the insulating film 228 by a sputtering method, and a 550-nm-thick silicon oxide film is formed as the insulating film 230 by a sputtering method.

An oxide semiconductor layer is formed over the insulating film 230 which is sufficiently planarized by the CMP treatment and is processed, so that an island-shaped oxide semiconductor layer 244 is formed. Note that after the formation of the oxide semiconductor layer, heat treatment for dehydration or dehydrogenation is preferably performed.

Next, a conductive layer is formed over the gate electrode layer 210, the insulating film 228, the insulating film 230, and the like and the conductive layer is selectively etched, so that a source or drain electrode layer 242a and a source or drain electrode layer 242b are formed.

The conductive layer can be formed by a PVD method such as a sputtering method or a CVD method such as a plasma CVD method. As the material of the conductive layer, an element selected from Al, Cr, Cu, Ta, Ti, Mo, and W, an alloy including any of the above elements as its component, or the like can be used. Any of Mn, Mg, Zr, Be, Nd, and Sc, or a material including any of these in combination may be used.

The conductive layer may have either a single-layer structure or a stacked-layer structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the source or drain electrode layer 242a and the source or drain electrode layer 242b can be easily processed to be tapered.

The channel length (L) of the transistor 262 in the upper portion is determined by a distance between a lower end portion of the source or drain electrode layer 242a and a lower end portion of the source or drain electrode layer 242b. Note that for light exposure for forming a mask used in the case where a transistor with a channel length (L) of less than 25 nm is formed, it is desirable to use extreme ultraviolet whose wavelength is as short as several nanometers to several tens of nanometers.

A gate insulating film 246 which is in contact with part of the oxide semiconductor layer 244 is formed. As the gate insulating film 246, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a gallium oxide film can be formed by a plasma CVD method, a sputtering method, or the like.

Over the gate insulating film 246, a gate electrode layer 248a and an electrode layer 248b are formed in a region overlapping with the oxide semiconductor layer 244 and a region overlapping with the source or drain electrode layer 242a, respectively.

The gate electrode layer 248a and the electrode layer 248b can be formed in such a manner that a conductive layer is formed over the gate insulating film 246 and then etched selectively.

After the gate electrode layer 248a is formed, treatment for adding an impurity element to the oxide semiconductor layer 244 may be performed.

As the impurity element to be added, phosphorus, boron, argon, or the like is used. As a method for adding the impurity element to the oxide semiconductor layer 244, an ion doping method or an ion implantation method can be used.

Note that the treatment for adding the impurity element to the oxide semiconductor layer 244 may be performed plural times. In the case where the treatment for adding the impurity element to the oxide semiconductor layer 244 is performed plural times, the kind of the impurity element may be the same in the plural treatments or different in every treatment.

When the impurity element is added to the oxide semiconductor layer 244, the gate electrode layer 248a serving as a mask, and the impurity element is not added to the oxide semiconductor layer 244 in a region overlapping with the gate electrode layer 248a, so that first regions 244a are formed. In addition, the first region 244a overlapping with the gate electrode layer 248a serves as a channel formation region.

The second region 244b and the second region 244c to which the impurity element is added also become amorphous regions where crystallinity is decreased owing to damage by addition of the impurity element. By adjusting the additive amount of the impurity element or the like, the degree of damage can be reduced so that the region is prevented from becoming completely amorphous. That is, the second region 244b and the second region 244c to which the impurity element is added each have a proportion of an amorphous region higher than at least the first region 244a. It is preferable that the region be not completely amorphous because crystallization through heat treatment performed later can be easily performed.

A pair of second regions 244b and 244c functions as lightly doped drain (LDD) regions which have lower resistance than the first region 244a. The existence of the second regions 244b and 244c containing the impurity element which function as the LDD regions can relax an electric field applied to an end portion of the first region 244a. Thus, a short-channel effect of the transistor can be suppressed.

In such a manner, the impurity element is added to the oxide semiconductor layer 244 utilizing the gate electrode layer 248a as a mask and then the heat treatment is performed; thus, the first region 244a serving as a channel formation region and the pair of second regions 244b and 244c which are LDD regions can be formed in a self-aligned manner.

An insulating film 250 including an aluminum oxide film is formed over the oxide semiconductor layer 244, the gate insulating film 246, the gate electrode layer 248a, and the electrode layer 248b. In the case where the insulating film 250 has a stacked-layer structure, a stack of the aluminum oxide film and a silicon oxide film, a silicon nitride film, a silicon oxynitride film, a silicon nitride oxide film, an aluminum nitride film, an aluminum oxynitride film, an aluminum nitride oxide film, a hafnium oxide film, or a gallium oxide film may be formed by a plasma CVD method, a sputtering method, or the like.

After the insulating film 250 is formed, second heat treatment is performed. The heat treatment is preferably performed at a temperature of higher than or equal to 350° C. and lower than or equal to 650° C., more preferably higher than or equal to 450° C. and lower than or equal to 650° C. The temperature of the heat treatment is preferably lower than the strain point of the substrate. Although the timing of the second heat treatment is not limited to that in this embodiment, the heat treatment needs to be performed at least after the insulating film 250 (more specifically the aluminum oxide film) is formed. This is because, since the aluminum oxide film used as the insulating film 250 has a high blocking effect and thus is less likely to transmit both oxygen and impurities such as hydrogen and water, release of oxygen from the oxide semiconductor layer 244 can be prevented by performing the heat treatment after the insulating film 250 is formed.

An insulating film 252 is formed over the transistor 262 and the insulating film 250. The insulating film 252 can be formed by a sputtering method, a CVD method, or the like. The insulating film 252 can be formed using a material including an inorganic insulating material such as silicon oxide, silicon oxynitride, silicon nitride, hafnium oxide, or aluminum oxide.

Next, an opening reaching the source or drain electrode layer 242b is formed in the gate insulating film 246, the insulating film 250, and the insulating film 252. The opening is formed by selective etching with the use of a mask or the like.

After that, a wiring in contact with the source or drain electrode layer 242b is formed in the opening. Note that FIG. 9A does not illustrate a portion where a wiring 256 and the source or drain electrode layer 242b are connected to each other.

The wiring 256 is formed in such a manner that a conductive layer is formed by a PVD method such as a sputtering method or a CVD method such as a plasma CVD method, and then the conductive layer is etched. Further, as a material of the conductive layer, an element selected from Al, Cr, Cu, Ta, Ti, Mo, and W, an alloy containing any of the above elements as its component, or the like can be used. Any of Mn, Mg, Zr, Be, Nd, and Sc, or a material including any of these in combination may be used. The details are the same as those of the source or drain electrode layer 242a or the like.

Through the above process, the transistor 262 and the capacitor 264 are completed. The transistor 262 includes the oxide semiconductor layer 244 which contains excess oxygen that compensates oxygen deficiency. Therefore, variation in the electric characteristics of the transistor 262 is suppressed, and the transistor 262 is electrically stable. The capacitor 264 includes the source or drain electrode layer 242a, the oxide semiconductor layer 244, the gate insulating film 246, and the electrode layer 248b.

Note that in the capacitor 264 in FIGS. 9A to 9C, insulation between the source or drain electrode layer 242a and the electrode layer 248b can be sufficiently secured by stacking the oxide semiconductor layer 244 and the gate insulating film 246. Needless to say, the capacitor 264 without the oxide semiconductor layer 244 may be employed in order to secure sufficient capacitance. Alternatively, an insulating film may be included in the capacitor 264. Further alternatively, the capacitor 264 may be omitted in the case where a capacitor is not needed.

FIG. 9C illustrates an example of a diagram of a circuit using the semiconductor device as a memory element. In FIG. 9C, one of a source electrode layer and a drain electrode layer of the transistor 262, one electrode layer of the capacitor 264, and a gate electrode layer of the transistor 260 are electrically connected to each other. A first wiring (1st Line, also referred to as a source line) is electrically connected to a source electrode layer of the transistor 260. A second wiring (2nd Line, also referred to as a bit line) is electrically connected to a drain electrode layer of the transistor 260. A third wiring (3rd Line, also referred to as a first signal line) is electrically connected to the other of the source electrode layer and the drain electrode layer of the transistor 262. A fourth wiring (4th Line, also referred to as a second signal line) is electrically connected to a gate electrode layer of the transistor 262. A fifth wiring (5th Line, also referred to as a word line) is electrically connected to the other electrode layer of the capacitor 264.

The transistor 262 including an oxide semiconductor has an extremely low off-state current; therefore, when the transistor 262 is turned off, the potential of a node (hereinafter, a node FG) where one of the source electrode layer and the drain electrode layer of the transistor 262, one electrode layer of the capacitor 264, and the gate electrode layer of the transistor 260 are electrically connected to each other can be held for an extremely long time. The capacitor 264 facilitates holding of charge given to the node FG and reading of the held data.

When data is stored in the semiconductor device (writing), first, the potential of the fourth wiring is set to a potential at which the transistor 262 is turned on, whereby the transistor 262 is turned on. Thus, the potential of the third wiring is applied to the node FG and a predetermined amount of charge is accumulated in the node FG. Here, charge for applying either of two different potential levels (hereinafter referred to as a low-level charge and a high-level charge) is given to the node FG. After that, the potential of the fourth wiring is set to a potential at which the transistor 262 is turned off, whereby the transistor 262 is turned off. This makes the node FG floating and the predetermined amount of charge is held in the node FG. The predetermined amount of charge is thus accumulated and held in the node FG, whereby the memory cell can store data.

Since the off-state current of the transistor 262 is extremely small, the charge applied to the node FG is held for a long time. This can remove the need of refresh operation or drastically reduce the frequency of the refresh operation, which leads to a sufficient reduction in power consumption. Moreover, stored data can be held for a long time even when power is not supplied.

When stored data is read out (reading), while a predetermined potential (a fixed potential) is applied to the first wiring, an appropriate potential (a read-out potential) is applied to the fifth wiring, whereby the transistor 260 changes its state depending on the amount of charge held in the node FG. This is because, in general, when the transistor 260 is an n-channel transistor, an apparent threshold value $V_{th\_H}$ of the transistor 260 in the case where a high-level charge is held in the node FG is lower than an apparent threshold value $V_{th\_L}$ of the transistor 260 in the case where a low-level charge is held in the node FG. Here, an apparent threshold voltage refers to the potential of the fifth wiring, which is needed to turn on the transistor 260. Thus, by setting the potential of the fifth wiring to a potential $V_0$ which is between $V_{th\_H}$ and $V_{th\_L}$, charge held in the node FG can be determined. For example, in the case where a high-level charge is given in writing, when the potential of the fifth wiring is set to $V_0$ ($>V_{th\_H}$), the transistor 260 is turned on. In the case where a low-level charge is given in writing, even when the potential of the fifth wiring is set to $V_0$ ($<V_{th\_L}$), the transistor 260 remains in an off state. In such a manner, by controlling the potential of the fifth wiring and determining whether the transistor 260 is in an on state or off state (reading out the potential of the second wiring), stored data can be read out.

Further, in order to rewrite stored data, a new potential is applied to the node FG that is holding the predetermined amount of charge given in the above writing, so that the charge of the new data is held in the node FG. Specifically, the potential of the fourth wiring is set to a potential at which the transistor 262 is turned on, whereby the transistor 262 is turned on. Consequently, the potential of the third wiring (a potential of new data) is applied to the node FG, and the predetermined amount of charge is accumulated in the node FG. After that, the potential of the fourth wiring is set to a potential at which the transistor 262 is turned off, whereby the transistor 262 is turned off. Thus, charge of the new data is held in the node FG. In other words, while the predetermined amount of charge given in the first writing is held in the node FG, the same operation (a second writing) as that in the first writing is performed, whereby the stored data can be overwritten.

The off-state current of the transistor 262 described in this embodiment can be sufficiently reduced by using an oxide semiconductor layer containing excess oxygen as the oxide semiconductor layer 244. Further, with the use of such a transistor, a semiconductor device capable of holding stored data for an extremely long time can be obtained.

As described above, the aluminum oxide film is formed over the oxide semiconductor layer, whereby water or hydrogen can be prevented from entering and diffusing into the oxide semiconductor layer from the air even when heat treatment is performed in a manufacturing process of a semiconductor device including an integrated circuit in which a plurality of transistors is stacked. Therefore, variation in the electric characteristics of the transistors is suppressed and the transistors are electrically stable. Thus, by using the transistors, a highly reliable semiconductor device can be provided.

The structures, methods, and the like described in this embodiment can be combined as appropriate with any of structures, the methods, and the like described in the other embodiments.

Embodiment 5

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the semiconductor device described in any of the above embodiments will be described.

Figure 10A:
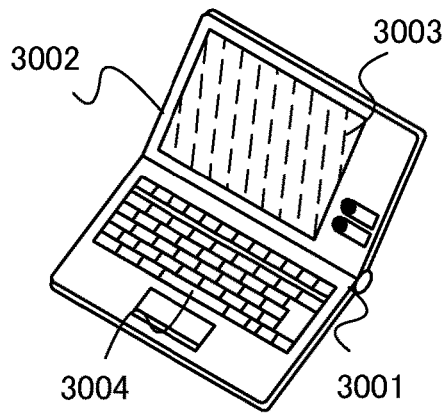
FIGS. 10A to 10F each illustrate an electronic appliance.

FIG. 10A illustrates a laptop personal computer, which includes a main body 3001, a housing 3002, a display portion 3003, a keyboard 3004, and the like. By applying the semiconductor device described in any of the above embodiments to the display portion 3003, a highly reliable laptop personal computer can be provided.

Figure 10B:
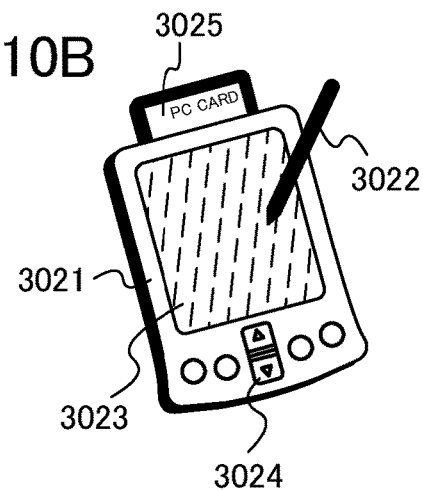

FIG. 10B is a personal digital assistant (PDA), which includes a main body 3021 provided with a display portion 3023, an external interface 3025, operation buttons 3024, and the like. A stylus 3022 is included as an accessory for operation. By applying the semiconductor device described in any of the above embodiments to the display portion 3023, a highly reliable personal digital assistant (PDA) can be provided.

Figure 10C:
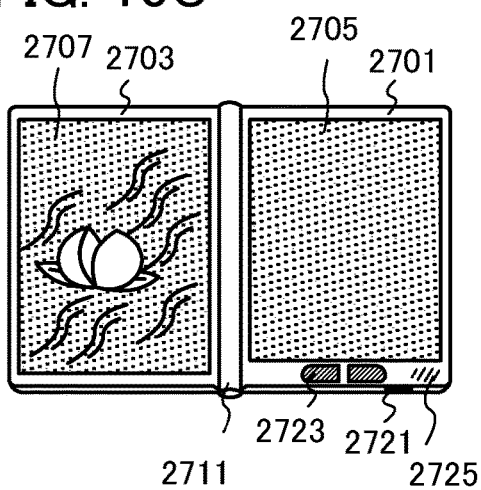

FIG. 10C illustrates an example of an electronic book reader. For example, the electronic book reader includes two housings, i.e., a housing 2701 and a housing 2703. The housing 2701 and the housing 2703 are combined with a hinge 2711 so that the electronic book reader can be opened and closed with the hinge 2711 as an axis. With such a structure, the electronic book reader can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 10C) displays text and the left display portion (the display portion 2707 in FIG. 10C) displays images. The semiconductor device described in any of the above embodiments is applied to the display portion 2705 and the display portion 2707, whereby a highly reliable electronic book reader can be provided. In the case of using a transflective or reflective liquid crystal display device as the display portion 2705, the electronic book reader may be used in a comparatively bright environment; therefore, a solar cell may be provided so that power generation by the solar cell and charge by a battery can be performed. When a lithium ion battery is used as the battery, there are advantages of downsizing and the like.

FIG. 10C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader may have a function of an electronic dictionary.

The electronic book reader may have a structure capable of wirelessly transmitting and receiving data. Through wireless communication, desired book data or the like can be purchased and downloaded from an electronic book server.

Figure 10D:
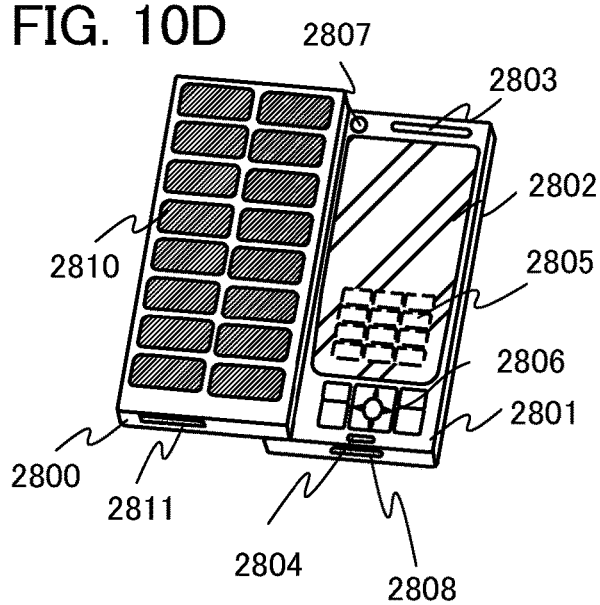

FIG. 10D illustrates a mobile phone, which includes two housings, i.e., a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. An antenna is incorporated in the housing 2801. By applying the semiconductor device described in any of the above embodiments to the display panel 2802, a highly reliable mobile phone can be provided.

Further, the display panel 2802 is provided with a touch panel. A plurality of operation keys 2805 which is displayed as images is illustrated by dashed lines in FIG. 10D. Note that a boosting circuit by which a voltage output from the solar cell 2810 is increased to be sufficiently high for each circuit is also provided.

On the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Furthermore, the housings 2800 and 2801 which are developed as illustrated in FIG. 10D can overlap with each other by sliding; thus, the size of the mobile phone can be decreased, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 10E:
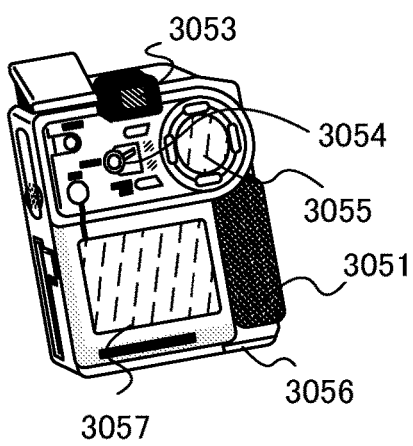

FIG. 10E illustrates a digital video camera which includes a main body 3051, a display portion A 3057, an eyepiece portion 3053, an operation switch 3054, a display portion B 3055, a battery 3056, and the like. By applying the semiconductor device described in any of the above embodiments to the display portion A 3057 and the display portion B 3055, a highly reliable digital video camera can be provided.

Figure 10F:
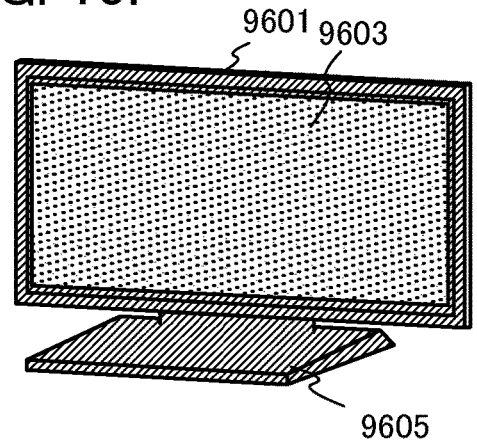

FIG. 10F illustrates an example of a television device. In the television set, a display portion 9603 is incorporated in a housing 9601. The display portion 9603 can display images. Here, the housing 9601 is supported by a stand 9605. By applying the semiconductor device described in any of the above embodiments to the display portion 9603, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with any of the structures described in the other embodiments.

Example 1

In this example, properties of an aluminum oxide film used as a barrier film in a semiconductor device according to one embodiment of the invention disclosed herein were evaluated. The results are shown in FIGS. 11A1, 11A2, 11B1, and 11B2, FIGS. 12A1, 12A2, 12B1, and 12B2, FIGS. 13A to 13D, and FIGS. 14A to 14D. As evaluation methods, secondary ion mass spectrometry (SIMS) and thermal desorption spectrometry (TDS) were used.

First, evaluation by SIMS analysis is described. As a comparative example, a comparative sample A was fabricated in such a manner that a silicon oxide film was formed to a thickness of 100 nm over a glass substrate by a sputtering method. Further, as an example, an example sample A was fabricated in such a manner that a silicon oxide film was formed to a thickness of 100 nm over a glass substrate by a sputtering method, and an aluminum oxide film was formed to a thickness of 100 nm over the silicon oxide film by a sputtering method.

For each of the comparative sample A and the example sample A, the silicon oxide film was formed under the following conditions: a silicon oxide ($SiO_2$) target was used as a target, the distance between the glass substrate and the target was 60 mm, the pressure was 0.4 Pa, the electric power was 1.5 kW, the atmosphere was an oxygen atmosphere (the oxygen flow rate was 50 sccm), and the substrate temperature was 100° C.

For the example sample A, the aluminum oxide film was formed under the following conditions: an aluminum oxide ($Al_2O_3$) target was used as a target, the distance between the glass substrate and the target was 60 mm, the pressure was 0.4 Pa, the electric power was 1.5 kW, the atmosphere was a mixed atmosphere containing argon and oxygen (the argon flow rate was 25 sccm and the oxygen flow rate was 25 sccm), and the substrate temperature was 250° C.

The comparative sample A and the example sample A were each subjected to a pressure cooker test (PCT). In the PCT in this example, the comparative sample A and the example sample A were held for 100 hours under the following conditions: the temperature was 130° C., the humidity was 85% (the volume ratio of water to deuterated water of water vapor contained in a gas is $H_2O$ (water):$D_2O$ (deuterated water)=3:1), and the atmospheric pressure was 2.3 atm (0.23 MPa).

In this example, a "D atom", e.g., deuterated water, expresses a hydrogen atom with a mass number of 2 ($^2H$).

As SIMS analysis, substrate side depth profile (SSDP) SIMS was used to measure concentrations of an H atom and a D atom in the comparative sample A and the example sample A before and after the PCT.

FIG. 11A1 shows H-atom and D-atom concentration profiles of the comparative sample A before the PCT, and FIG. 11A2 shows H-atom and D-atom concentration profiles of the comparative sample A after the PCT, which were obtained using SIMS. In FIGS. 11A1 and 11A2, a D-atom expected concentration profile is a calculated concentration profile of the D atom existing in nature, which was obtained using the H-atom concentration profile on the assumption that the abundance ratio of the D atom thereto is 0.015%. Therefore, the amount of the D atom mixed into the sample by the PCT equals the difference between the measured D-atom concentration after the PCT and the D-atom expected concentration after the PCT. FIG. 11B1 shows a D-atom concentration profile before the PCT, which was obtained by subtracting the D-atom expected concentration from the measured D-atom concentration, and FIG. 11B2 shows a D-atom concentration profile after the PCT, which was obtained by subtracting the D-atom expected concentration from the measured D-atom concentration.

In a similar manner, FIG. 12A1 shows H-atom and D-atom concentration profiles of the example sample A before the PCT, and FIG. 12A2 shows H-atom and D-atom concentration profiles of the example sample A after the PCT, which were obtained using SIMS. Further, FIG. 12B1 shows a D-atom concentration profile before the PCT, which was obtained by subtracting the D-atom expected concentration from the measured D-atom concentration, and FIG. 12B2 shows a D-atom concentration profile after the PCT, which was obtained by subtracting the D-atom expected concentration from the measured D-atom concentration.

Note that all the results of SIMS analysis in this example were quantified using a standard sample of a silicon oxide film.

As shown in FIGS. 11A1, 11A2, 11B1, and 11B2, while the measured D-atom concentration profile overlaps with the D-atom expected concentration profile before the PCT, the measured D-atom concentration greatly increases after the PCT; accordingly, it is found that the D atom was mixed into the silicon oxide film. Therefore, it is confirmed that the silicon oxide film of the comparative sample A has a low bather property with respect to water ($H_2O$ and $D_2O$) from the outside.

In contrast, as shown in FIGS. 12A1, 12A2, 12B1, and 12B2, as for the example sample A in which the aluminum oxide film was stacked over the silicon oxide film, it is found that only a slight amount of D atom entered a surface region of the aluminum oxide film by the PCT and that the D atom entered neither the aluminum oxide film at a depth around 50 nm or greater nor the silicon oxide film. Therefore, it is confirmed that the aluminum oxide film has a high barrier property with respect to water ($H_2O$ and $D_2O$) from the outside.

The following shows evaluation by TDS analysis. As an example sample, an example sample B was fabricated in such a manner that a silicon oxide film was formed to a thickness of 100 nm over a glass substrate by a sputtering method, and an aluminum oxide film was formed to a thickness of 20 nm over the silicon oxide film by a sputtering method. Further, as a comparative example, a comparative sample B was fabricated in such a manner that after the example sample B was measured by TDS analysis, the aluminum oxide film thereof was removed, and only the silicon oxide film was left over the glass substrate.

For each of the comparative sample B and the example sample B, the silicon oxide film was formed under the following conditions: a silicon oxide ($SiO_2$) target was used as a target, the distance between the glass substrate and the target was 60 mm, the pressure was 0.4 Pa, the electric power was 1.5 kW, the atmosphere was an oxygen atmosphere (the oxygen flow rate was 50 sccm), and the substrate temperature was 100° C.

For the example sample B, the aluminum oxide film was formed under the following conditions: an aluminum oxide ($Al_2O_3$) target was used as a target, the distance between the glass substrate and the target was 60 mm, the pressure was 0.4 Pa, the electric power was 1.5 kW, the atmosphere was a mixed atmosphere containing argon and oxygen (the argon flow rate was 25 sccm and the oxygen flow rate was 25 sccm), and the substrate temperature was 250° C.

Other three types of the comparative sample B and the example sample B were fabricated by further performing heat treatment at 300° C., 450° C., and 600° C., respectively. The heat treatment was performed for 1 hour in a nitrogen atmosphere for each sample.

Figure 13A:
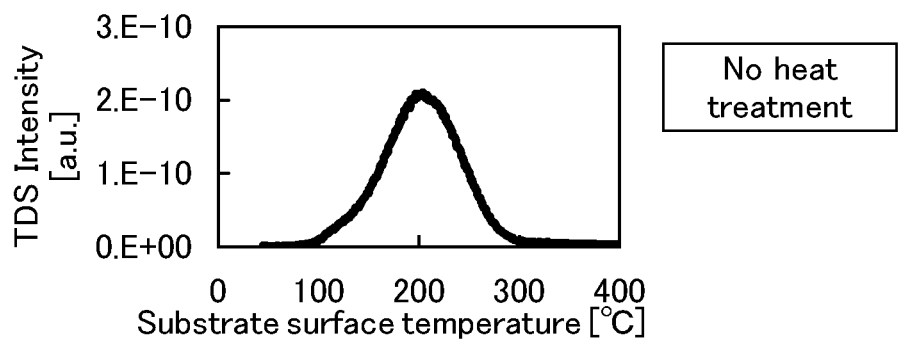
FIGS. 13A to 13D show TDS data of a comparative sample B.
Figure 13B:
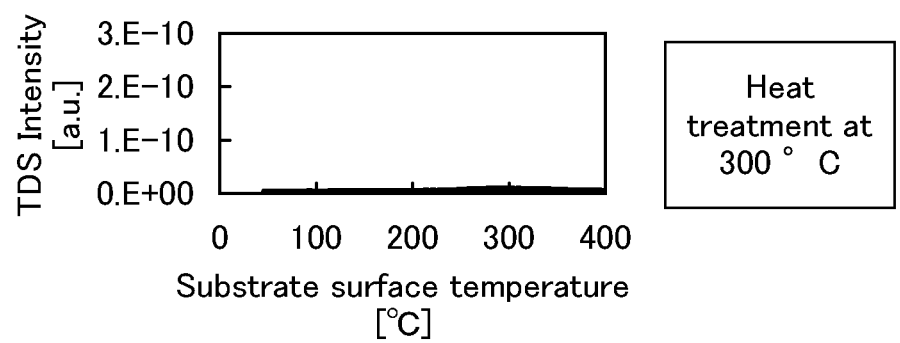
Figure 13C:
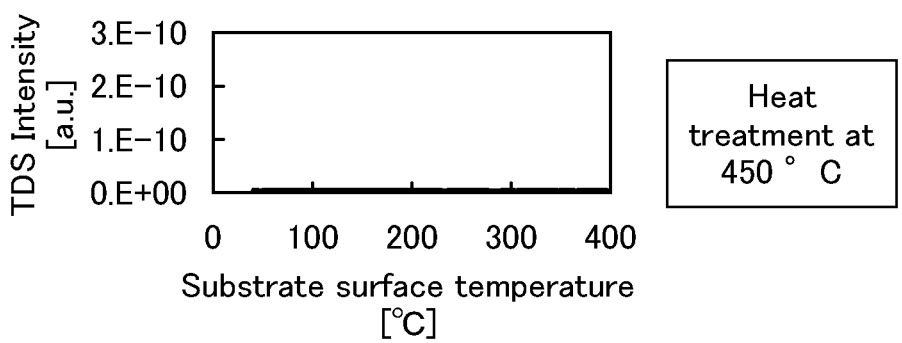
Figure 13D:
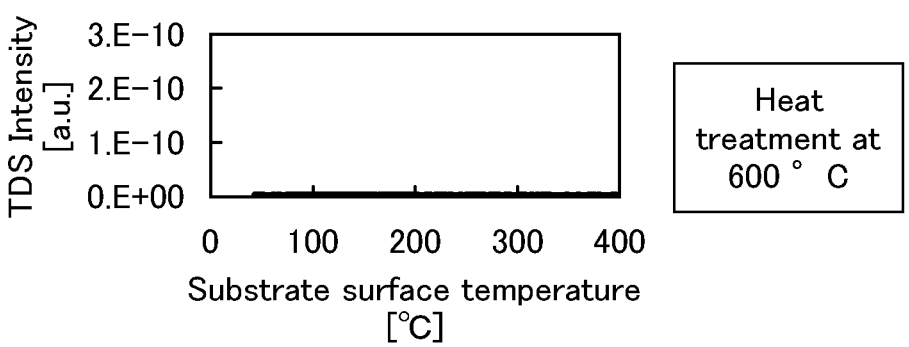
Figure 14A:
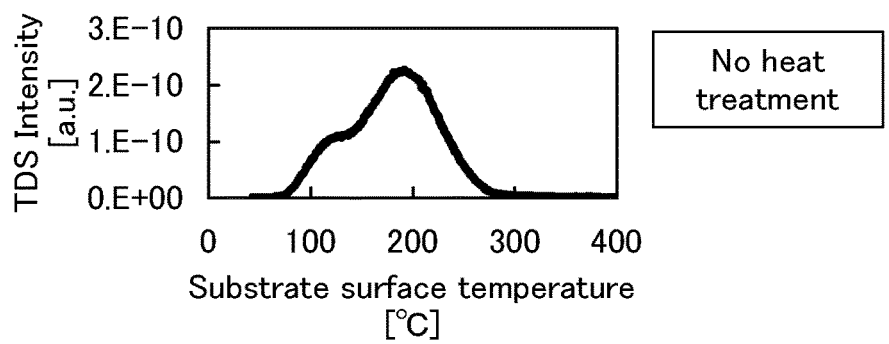
FIGS. 14A to 14D show TDS data of an example sample B.
Figure 14B:
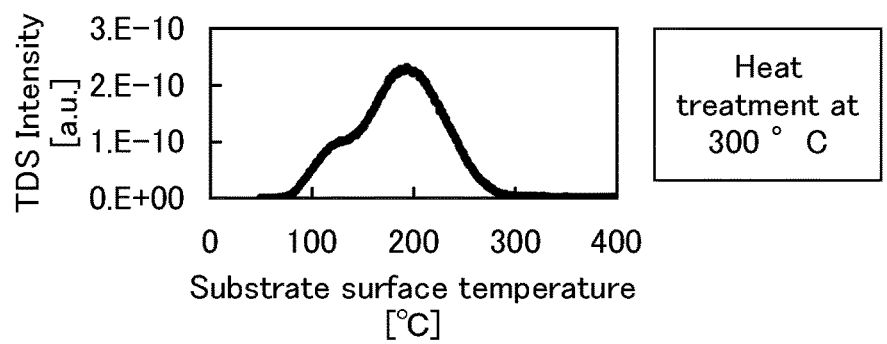
Figure 14C:
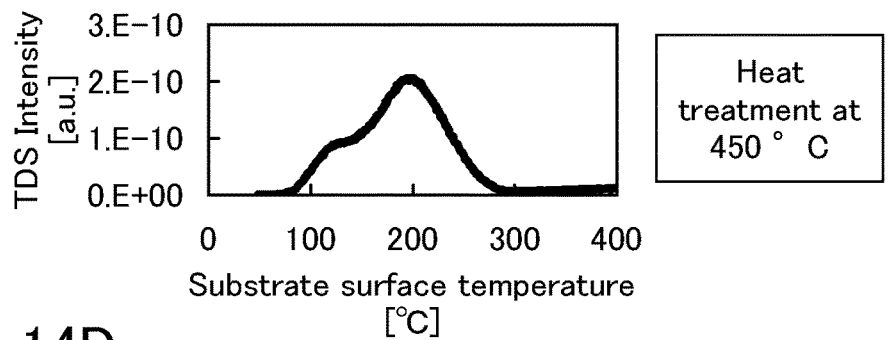
Figure 14D:
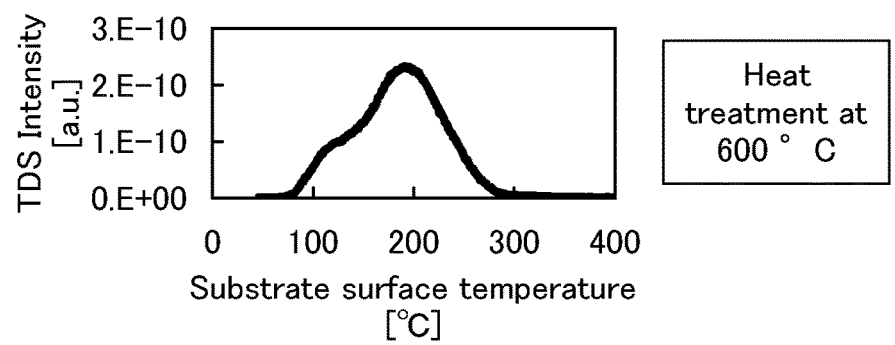

TDS analysis was performed on the four types of the comparative sample B and the four types of the example sample B fabricated under the respective four conditions (without heat treatment, with 300° C. heat treatment, with 450° C. heat treatment, and with 600° C. heat treatment). FIG. 13A shows a TDS spectrum of the comparative sample B subjected to no heat treatment, FIG. 13B shows that of the comparative sample B subjected to heat treatment at 300° C., FIG. 13C shows that of the comparative sample B subjected to heat treatment at 450° C., and FIG. 13D shows that of the comparative sample B subjected to heat treatment at 600° C., each at M/z=32 ($O_2$). Further, FIG. 14A shows a TDS spectrum of the example sample B subjected to no heat treatment, FIG. 14B shows that of the example sample B subjected to heat treatment at 300° C., FIG. 14C shows that of the example sample B subjected to heat treatment at 450° C., and FIG. 14D shows that of the example sample B subjected to heat treatment at 600° C., each at M/z=32 ($O_2$).

As shown in FIGS. 13A to 13D, it can be seen in FIG. 13A that oxygen was released from the silicon oxide film of the comparative sample B which was not subjected to heat treatment, but the amount of oxygen released was greatly decreased in the comparative sample B subjected to the heat treatment at 300° C. in FIG. 13B, and became smaller than or equal to a background level of TDS measurement in the comparative sample B subjected to the heat treatment at 450° C. in FIG. 13C and the comparative sample B subjected to the heat treatment at 600° C. in FIG. 13D.

The results in FIGS. 13A to 13D indicate that 90% or more of excess oxygen contained in the silicon oxide film was released outside the silicon oxide film by the heat treatment at 300° C. and that substantially all of the excess oxygen contained in the silicon oxide film was released outside the silicon oxide film by the heat treatment at 450° C. and 600° C. Therefore, it is confirmed that the silicon oxide film has a low barrier property with respect to oxygen.

In contrast, as shown in FIGS. 14A to 14D, substantially the same amount of oxygen was released from every type of the example sample B, in which the aluminum oxide film was formed over the silicon oxide film, regardless of whether the heat treatment was not performed or was performed at 300° C., 450° C., and 600° C.

The results in FIGS. 14A to 14D indicate that when the aluminum oxide film was formed over the silicon oxide film, the excess oxygen contained in the silicon oxide film was not easily released to the outside by heat treatment and the state where the excess oxygen was contained in the silicon oxide film was held. Therefore, it is confirmed that the aluminum oxide film has a high bather property with respect to oxygen to a considerable extend.

The above results confirm that the aluminum oxide film has both a high barrier property with respect to hydrogen and water and a high bather property with respect to oxygen, and functions suitably as a barrier film with respect to hydrogen, water, and oxygen.

Therefore, since the aluminum oxide film serves as a barrier film, during and after a manufacturing process of a transistor, in which the aluminum oxide film is formed over and in contact with the gate insulating film and the gate electrode layer after the oxide semiconductor layer, the source electrode layer, the drain electrode layer, the gate insulating film, and the gate electrode layer are formed in this order, entry of impurities such as hydrogen and water into the oxide semiconductor layer and release of oxygen, which is a main component material of the oxide semiconductor, from the oxide semiconductor layer can be prevented.

Example 2

In this example, the measurement results of characteristics of a transistor in which an aluminum oxide film is used as a barrier film in a semiconductor device according to one embodiment of the invention disclosed herein are described.

First, a method for manufacturing a transistor of an example sample C is described.

A silicon oxide layer serving as a base insulating film was formed to a thickness of 300 nm over a silicon substrate by a sputtering method. The silicon oxide layer serving as a base insulating film was formed under the following conditions: a silicon oxide ($SiO_2$) target was used as a target, the distance between the glass substrate and the target was 60 mm, the pressure was 0.4 Pa, the electric power was 1.5 kW, the atmosphere was an oxygen atmosphere (the oxygen flow rate was 50 sccm), and the substrate temperature was 100° C.

Next, an In—Ga—Zn—O-based oxide semiconductor layer serving as an oxide semiconductor layer was formed to a thickness of 20 nm over the silicon oxide layer. The In—Ga—Zn—O-based oxide semiconductor layer serving as an oxide semiconductor layer was formed under the following conditions: a target having a composition ratio of In:Ga:Zn=1:1:1 was used as a target, the pressure was 0.4 Pa, the electric power was 0.5 kW, the atmosphere was a mixed atmosphere containing argon and oxygen (the argon flow rate was 30 sccm and the oxygen flow rate was 15 sccm), and the substrate temperature was 250° C.

Heat treatment was performed at 400° C. for 30 minutes under reduced pressure after the formation of the oxide semiconductor layer.

Next, a tungsten layer serving as a source electrode layer and a drain electrode layer was formed to a thickness of 100 nm over the oxide semiconductor layer. A silicon oxynitride film serving as a gate insulating film was formed to a thickness of 30 nm over the source electrode layer and the drain electrode layer by a CVD method. A tantalum nitride layer with a thickness of 15 nm and a tungsten layer with a thickness of 135 nm were stacked in this order over the gate insulating film in a region overlapping with the oxide semiconductor layer, to form a gate electrode layer.

Then, phosphorus was added to the oxide semiconductor layer at an acceleration voltage of 40 kV and a dose of $1 \times 10^{15}$ ions/cm$^2$, and heat treatment was performed at 450° C. for 1 hour in a nitrogen atmosphere.

After phosphorus was added, an aluminum oxide film serving as an insulating film was formed to a thickness of 100 nm over the gate insulating film and the gate electrode layer by a sputtering method. The aluminum oxide film was formed under the following conditions: an aluminum oxide ($Al_2O_3$) target was used as a target, the distance between the substrate and the target was 60 mm, the pressure was 0.4 Pa, the electric power was 1.5 kW, the atmosphere was a mixed atmosphere containing argon and oxygen (the argon flow rate was 25 sccm and the oxygen flow rate was 25 sccm), and the substrate temperature was 250° C.

Next, a silicon oxynitride film was formed to a thickness of 300 nm over the aluminum oxide film by a CVD method, and thus the example sample C was fabricated.

In addition, a method for manufacturing a transistor of a comparative sample C for comparing characteristics thereof with the characteristics of the transistor of the example sample C is described.

The comparative sample C was fabricated in such a manner that the steps up to the step of adding phosphorus were performed similarly to those of the example sample C, and after phosphorus was added, a silicon oxynitride film was formed to a thickness of 300 nm over the gate insulating film and the gate electrode layer by a CVD method.

The comparative sample C and the example sample C were subjected to heat treatment at 450° C. for 1 hour in a nitrogen atmosphere.

Figure 15:
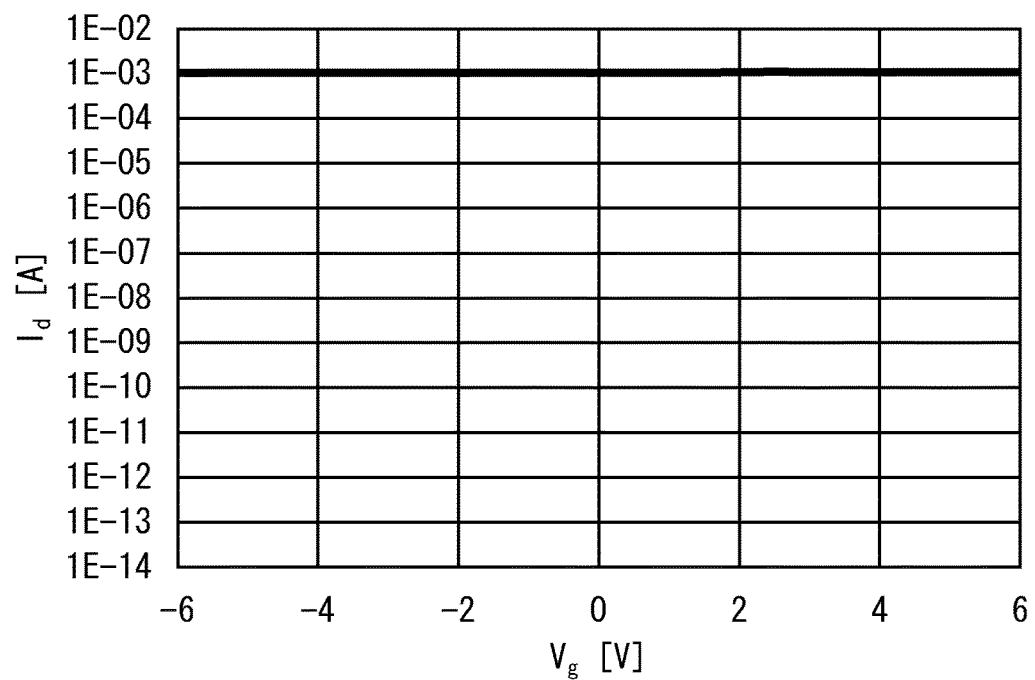
FIG. 15 shows characteristics of a transistor including a comparative sample C.
Figure 16:
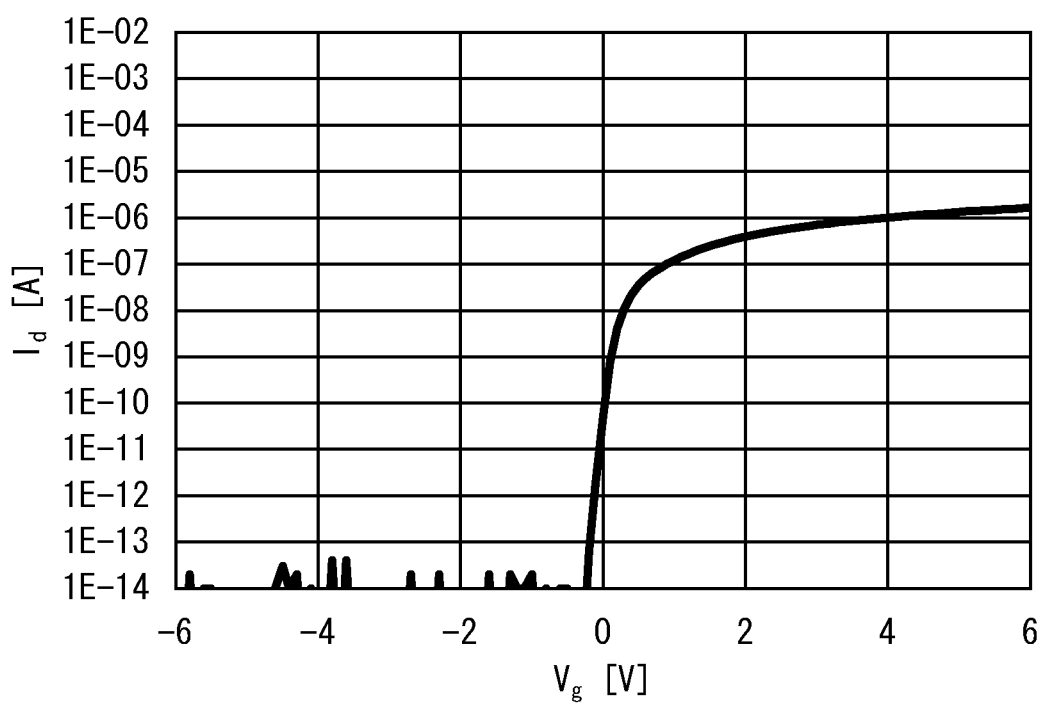
FIG. 16 shows characteristics of a transistor including an example sample C.

In this example, in the transistors of the comparative sample C and the example sample C, the drain current ($I_d$: [A]) was measured under conditions that the drain voltage ($V_d$) was set to 3V and the gate voltage ($V_g$) was swept from −6 V to 6V. FIG. 15 and FIG. 16 show the measurement results. In FIG. 15 and FIG. 16, the horizontal axis indicates gate voltage ($V_g$ [V]) and the vertical axis indicates drain current ($I_d$ [A]). Note that "drain voltage ($V_d$)" refers to a potential difference between a drain and a source when the potential of the source is used as a reference potential, and "gate voltage ($V_g$)" refers to a potential difference between a gate and a source when the potential of the source is used as a reference potential.

As shown in FIG. 15, the transistor of the comparative sample C did not change significantly even when the gate voltage was swept. Thus, it is found that in the transistor of the comparative sample C, the on/off ratio cannot be ensured and normal switching characteristics cannot be obtained.

On the other hand, as shown in FIG. 16, the transistor of the example sample C had a drain current (also referred to as an on-state current) of $10^{-6}$ A in an on state and a drain current (also referred to as an off-state current) of $10^{-14}$ A in an off state. Thus, it is found that in the transistor of the example sample C, the on/off ratio can be ensured and normal switching characteristics can be obtained.

The difference between the example sample C and the comparative sample C is whether or not the aluminum oxide film is formed just before the formation of the silicon oxynitride film. Therefore, it is found that in the example sample C, due to an effect of the aluminum oxide film, variation in the electric characteristics of the transistor is suppressed and the transistor is electrically stable.

As described in Example 1, the aluminum oxide film suitably functions as a barrier film with respect to hydrogen, water, and oxygen. Thus, in a structure in which the aluminum oxide film is formed to cover the oxide semiconductor layer and be over and in contact with the gate insulating film and the gate electrode layer, entry of hydrogen and water into the oxide semiconductor layer and release of oxygen from the oxide semiconductor layer can be prevented even when heat treatment is performed. The above results indicate that with the above-described structure, the on/off ratio can be ensured and normal switching characteristics are obtained even when heat treatment is performed on a miniaturized transistor, and variation in the electric characteristics of the transistor is suppressed and the transistor is electrically stable.

As described above, a semiconductor device using an oxide semiconductor, which includes the transistor, can have stable electric characteristics and high reliability.

This application is based on Japanese Patent Application serial no. 2011-084389 filed with Japan Patent Office on Apr. 6, 2011, the entire contents of which are hereby incorporated by reference.

What is claimed is:

1. A method for manufacturing a semiconductor device comprising the steps of:
    forming an oxide semiconductor layer;
    forming a source electrode layer and a drain electrode layer over the oxide semiconductor layer;
    forming a gate insulating film adjacent to the oxide semiconductor layer after forming the source electrode layer and the drain electrode layer;
    forming a gate electrode layer adjacent to the oxide semiconductor layer with the gate insulating film interposed therebetween,
    adding an impurity element to the oxide semiconductor layer using the source electrode layer, the drain electrode layer, and the gate electrode layer as masks after forming the gate insulating film and the gate electrode layer;

forming an aluminum oxide film over the gate electrode layer; and performing first heat treatment on at least the oxide semiconductor layer and the aluminum oxide film after forming the aluminum oxide film, wherein a thickness of the aluminum oxide film is greater than 50 nm and less than or equal to 500 nm, and wherein the gate insulating film is in contact with a top surface of the source electrode layer and a top surface of the drain electrode layer.

2. The method for manufacturing a semiconductor device, according to claim 1, further comprising the step of performing second heat treatment on the oxide semiconductor layer just after the oxide semiconductor layer is formed.

3. The method for manufacturing a semiconductor device, according to claim 1, further comprising the step of forming an interlayer insulating film over the aluminum oxide film.

4. The method for manufacturing a semiconductor device, according to claim 3, wherein the interlayer insulating film is formed of silicon oxynitride.

5. The method for manufacturing a semiconductor device, according to claim 1, wherein the gate insulating film includes a region in which an oxygen content is higher than a stoichiometric proportion of the gate insulating film.

6. The method for manufacturing a semiconductor device, according to claim 1, wherein a channel length determined by a distance between the source electrode layer and the drain electrode layer which are adjacent to each other over the oxide semiconductor layer is less than or equal to 2 μm.

7. The method for manufacturing a semiconductor device, according to claim 2, wherein an inert gas is changed to a gas containing oxygen during the second heat treatment.

8. A method for manufacturing a semiconductor device comprising the steps of:

forming a base insulating film;

forming an oxide semiconductor layer over and in contact with the base insulating film;

performing first heat treatment on the oxide semiconductor layer;

forming a source electrode layer and a drain electrode layer over the oxide semiconductor layer;

forming a gate insulating film over and in contact with the oxide semiconductor layer, the source electrode layer, and the drain electrode layer after forming the source electrode layer and the drain electrode layer;

forming a gate electrode layer over the gate insulating film in a region overlapping with the oxide semiconductor layer;

adding an impurity element to the oxide semiconductor layer using the source electrode layer, the drain electrode layer, and the gate electrode layer as masks after forming the gate insulating film and the gate electrode layer;

forming an aluminum oxide film over and in contact with the gate insulating film and the gate electrode layer; and performing second heat treatment on the oxide semiconductor layer and the aluminum oxide film after forming the aluminum oxide film, wherein a thickness of the aluminum oxide film is greater than 50 nm and less than or equal to 500 nm, and wherein an inert gas is changed to a gas containing oxygen during the first heat treatment.

9. The method for manufacturing a semiconductor device, according to claim 8, further comprising the step of forming an interlayer insulating film over the aluminum oxide film.

10. The method for manufacturing a semiconductor device, according to claim 9, wherein the interlayer insulating film is formed of silicon oxynitride.

11. The method for manufacturing a semiconductor device, according to claim 8, wherein the base insulating film includes a region in which an oxygen content is higher than a stoichiometric proportion of the base insulating film or the gate insulating film includes a region in which an oxygen content is higher than a stoichiometric proportion of the gate insulating film.

12. The method for manufacturing a semiconductor device, according to claim 8, wherein a channel length determined by a distance between the source electrode layer and the drain electrode layer which are adjacent to each other over the oxide semiconductor layer is less than or equal to 2 μm.

13. The method for manufacturing a semiconductor device, according to claim 8, wherein the gate insulating film is in contact with a top surface of the source electrode layer and a top surface of the drain electrode layer.

14. A method for manufacturing a semiconductor device comprising the steps of:

manufacturing a transistor by a method comprising the steps of:

forming a base insulating film;

forming an oxide semiconductor layer over and in contact with the base insulating film;

performing first heat treatment on the oxide semiconductor layer;

forming a source electrode layer and a drain electrode layer over the oxide semiconductor layer;

forming a gate insulating film over and in contact with the oxide semiconductor layer, the source electrode layer, and the drain electrode layer after forming the source electrode layer and the drain electrode layer;

forming a gate electrode layer over the gate insulating film in a region overlapping with the oxide semiconductor layer;

adding an impurity element to the oxide semiconductor layer using the source electrode layer, the drain electrode layer, and the gate electrode layer as masks after forming the gate insulating film and the gate electrode layer; and forming an aluminum oxide film over and in contact with the gate insulating film and the gate electrode layer; and performing second heat treatment on the transistor and the aluminum oxide film after forming the aluminum oxide film, wherein a thickness of the aluminum oxide film is greater than 50 nm and less than or equal to 500 nm, and wherein an inert gas is changed to a gas containing oxygen during the first heat treatment.

15. The method for manufacturing a semiconductor device, according to claim 14, further comprising the step of forming an interlayer insulating film over the aluminum oxide film.

16. The method for manufacturing a semiconductor device, according to claim 15, wherein the interlayer insulating film is formed of silicon oxynitride.

17. The method for manufacturing a semiconductor device, according to claim 14, wherein the base insulating film includes a region in which an oxygen content is higher than a stoichiometric proportion of the base insulating film or the gate insulating film includes a region in which an oxygen content is higher than a stoichiometric proportion of the gate insulating film.

18. The method for manufacturing a semiconductor device, according to claim 14, wherein a channel length determined by a distance between the source electrode layer and the drain electrode layer which are adjacent to each other over the oxide semiconductor layer is less than or equal to 2 µm.

19. The method for manufacturing a semiconductor device, according to claim 14, wherein the gate insulating film is in contact with a top surface of the source electrode layer and a top surface of the drain electrode layer.

* * * * *